United States Patent
Kitamura et al.

(10) Patent No.: US 7,282,094 B2
(45) Date of Patent: Oct. 16, 2007

(54) METHOD OF SIMULATION WITH RESPECT TO DENSITY DISTRIBUTION AND SIZE DISTRIBUTION OF VOID DEFECT WITHIN SINGLE CRYSTAL AND OXYGEN PRECIPITATION NUCLEUS WITHIN SINGLE CRYSTAL

(75) Inventors: Kounosuke Kitamura, Tokyo (JP); Jun Furukawa, Tokyo (JP); Naoki Ono, Tokyo (JP)

(73) Assignee: Sumco Corporation, Tokyo (JP)

(*) Notice: Subject to any disclaimer, the term of this patent is extended or adjusted under 35 U.S.C. 154(b) by 193 days.

(21) Appl. No.: 10/558,790

(22) PCT Filed: May 30, 2003

(86) PCT No.: PCT/JP04/06822

§ 371 (c)(1),
(2), (4) Date: Nov. 28, 2005

(87) PCT Pub. No.: WO2004/106594

PCT Pub. Date: Dec. 9, 2004

(65) Prior Publication Data

US 2006/0243192 A1    Nov. 2, 2006

(30) Foreign Application Priority Data

May 28, 2003  (JP)  ............................. 2003-150262
Jun. 6, 2003  (JP)  ............................. 2003-161493

(51) Int. Cl.
*C30B 13/28* (2006.01)
(52) U.S. Cl. .................... 117/15; 117/2; 117/3; 117/13; 117/14; 117/20; 117/29; 117/202; 117/932
(58) Field of Classification Search ............... 117/2, 117/3, 13, 14, 15, 20, 29, 202, 932
See application file for complete search history.

(56) References Cited

U.S. PATENT DOCUMENTS

| 5,154,795 A | * | 10/1992 | Ishida et al. ................... 117/15 |
| 5,223,078 A | * | 6/1993 | Maeda et al. .................. 117/15 |
| 5,476,065 A | * | 12/1995 | Ikezawa et al. ............. 117/217 |
| 5,573,591 A | * | 11/1996 | Ikezawa et al. ............... 117/20 |
| 5,779,791 A | * | 7/1998 | Korb et al. .................... 117/15 |

FOREIGN PATENT DOCUMENTS

JP    2003-040695    2/2003

OTHER PUBLICATIONS

Kitamura, K. et al., "Radial distribution of temperature gradients in growing CZ-Si crystals and its application to the prediction of microdefect distribution" "Journal of Crystal Growth" 242 (2002) pp. 293-301.

*Primary Examiner*—Robert Kunemund
*Assistant Examiner*—G. Nagesh Rao
(74) *Attorney, Agent, or Firm*—Reed Smith LLP

(57) ABSTRACT

To precisely predict the distribution of densities and sizes of void defects comprising voids and inner wall oxide membranes in a single crystal. The computer-based simulation determines, at steps 1 to 7, the distribution of temperatures within a single crystal 14 growing from a melt 12 from the time of its pulling-up to the time of its completing cooling with due consideration paid to convection currents in the melt 12. The computer-based simulation, at steps 8 to 15, determines the density of voids considering the cooling process of the single crystal separated from the melt, that is, the pulling-up speed of the single crystal after the separation from the melt, and reflecting the effect of slow and rapid cooling of the single crystal in the result, and relates the radius of voids with the thickness of inner wall oxide membrane developed around the voids.

2 Claims, 14 Drawing Sheets

U.S. PATENT DOCUMENTS

| | | | |
|---|---|---|---|
| 5,948,159 A * | 9/1999 | Nakamura et al. | 117/13 |
| 6,159,282 A * | 12/2000 | Fujiwara | 117/13 |
| 6,171,391 B1 * | 1/2001 | Fuerhoff et al. | 117/14 |
| 6,187,090 B1 * | 2/2001 | Maeda et al. | 117/14 |
| 6,451,107 B2 * | 9/2002 | Kitamura et al. | 117/15 |
| 7,074,271 B2 * | 7/2006 | Furukawa et al. | 117/13 |
| 7,195,669 B2 * | 3/2007 | Wakabayashi et al. | 117/17 |
| 2001/0042504 A1 | 11/2001 | Kitamura et al. | |

* cited by examiner

METHOD OF SIMULATION WITH RESPECT TO DENSITY DISTRIBUTION AND SIZE DISTRIBUTION OF VOID DEFECT WITHIN SINGLE CRYSTAL AND OXYGEN PRECIPITATION NUCLEUS WITHIN SINGLE CRYSTAL

CROSS-REFERENCES TO RELATED APPLICATIONS

This application claims International Application PCT/JP2004/006822 filed May 20, 2004 and priority of Japanese Application Nos. 2003-150262 filed May 28, 2003 and 2003-161493 filed Jun. 6, 2003, the entire disclosure of which is hereby incorporated by reference.

TECHNICAL FIELD

The present invention relates to a computer-based simulation for predicting the distribution of densities and sizes of grow-in defects and oxygen precipitation nuclei developed within a single crystal of a substance such as silicon during its formation like the one pulled up from a crucible according to the Czochralski method (CZ method hereinafter). The term "grow-in defect" used herein refers to a void defect comprising a void and an inner wall oxide membrane, and includes, for example, crystal originated particles (COP hereinafter), which may be observed on the surface of a wafer, and laser scattering tomograph defects (LSTD), which may be observed in the structure of the crystal itself. The oxygen precipitation nucleus refers to a nucleus formed as a result of the consumption of oxygen in air holes within the structure of a single crystal. When an affected single crystal is heated to a comparatively low temperature (700 to 800° C.) so that such nuclei can be stabilized, and further heated to a higher temperature (1000 to 1100° C.) so that they can grow in size, they will be observed under an optical microscope as bulk micro-defects (BMD).

BACKGROUND ART

To predict the distribution of such defects within a single crystal, a method has been known which consists of applying an overall heat conduction simulation to a silicon single crystal 4 pulled up from a pulling-up machine 1 according to the CZ method as shown in FIG. 11. The method comprises the steps of predicting the distribution of temperatures within a silicon melt 2 by working on the heat conductivity of silicon melt 2 making allowance for the structural elements of a hot zone of the pulling-up machine 1 and the pulling-up speed of silicon single crystal 4, applying a mesh over the silicon single crystal 4 and determining, for each mesh, its coordinates and temperature from the internal temperature distribution, and solving a diffusion equation based on the diffusion coefficients of silicon atoms and air holes within an inter-lattice space of silicon single crystal 4 and boundary conditions using a computer, thereby determining the distribution of silicon atoms and air holes in the inter-lattice space. According to this simulation method, members constituting the hot zone are covered with a mesh for modeling. What is noteworthy is that each of the mesh applied to silicon melt 2 has a rather gross area or a square of about 10 mm, in order to reduce the time of computation.

A method for producing a silicon single crystal by the CZ method has also been known which consists of feeding, as input, the operation condition of the machine and temperature distribution within the crucible to a computer, thereby allowing the computer to predict, by simulation, the sizes and densities of grow-in defects due to air holes which might develop in the single crystal at the given growth speed of crystal based on a known relationship, and adjusting, based on the above simulation result, the machine such that the growth speed of crystal is kept at a specified level so as to make the sizes and densities of grow-in defects which might develop within the single crystal during its formation equal to or below predetermined thresholds (see, for example, Patent literature 1). This method uses an overall heat conduction analysis program to simulate the heat distribution within a crucible and determines the temperature gradient along a vertical axis passing through the center of a growing single crystal.

Patent literature 1: Japanese Unexamined Patent Application Publication No. 2002-145696

DISCLOSURE OF INVENTION

Problems to be Solved by the Invention

However, the above conventional method for predicting, by simulation, the distribution of densities of inter-lattice silicon atoms and air holes has the following problems: it ignores convection currents which exist in a real silicon melt worked by a pulling-up machine; the mesh applied to a silicon melt is rather coarse, and thus reproducibility of the shape of solid-liquid interface is so degraded as to disable the precise prediction of the temperature distribution within a single crystal. Thus, the distribution of densities of inter-lattice silicon atoms and air holes in a silicon single crystal predicted by this method may considerably diverge from the result actually obtained by measurement. Furthermore, according to the conventional simulation method described above, it is not possible to identify the types of defects such as voids and oxygen precipitations which may develop within a silicon single crystal at a comparatively high temperature during a crystal cooling process, nor to determine the distribution of densities and sizes of those defects. In addition, according to the above simulation method, it is not possible to predict the distribution of densities and sizes of oxygen precipitation nuclei as a defect, which will develop in a silicon single crystal at a comparatively low temperature during a crystal cooling process.

According to the conventional method for producing a silicon single crystal described in the patent literature 1, it is not possible to predict the distribution of sizes and densities of grow-in defects along the radial direction of a silicon single crystal, although it predicts the distribution of sizes and densities of grow-in defects in the silicon single crystal along its vertical axis, and thus it is not possible based on the result provided by the method to have an insight into the state of grow-in defects in the structure of a wafer.

A first object of the present invention is to provide a simulation method for predicting the distribution of densities and sizes of void defects in a single crystal, the method enabling a precise prediction of the distribution of densities and sizes of void defects constituted of voids and inner wall oxide membranes within a single crystal by analyzing the temperature distribution within the single crystal while it is growing with a due consideration paid to the convention currents existent in a melt, and then by analyzing the cooling process to which the single crystal will be subjected after the single crystal is separated from the melt.

A second object of the present invention is to provide a simulation method for predicting the distribution of densities and sizes of oxygen precipitation nuclei in a single crystal, the method enabling a precise prediction of the distribution of densities and sizes of oxygen precipitation nuclei within a single crystal by analyzing the temperature distribution within the single crystal while it is growing with a due consideration paid to the convection currents existent in a melt, and then by analyzing the cooling process to which the single crystal will be subjected after the single crystal is separated from the melt.

Means for Solving the Problems

As shown in FIGS. 1 to 6, an aspect of the invention described in Claim 1 relates to a computer-based simulation method for predicting the distribution of densities and sizes of void defects in a single crystal, the method comprising: a first step of applying a mesh onto each member in a hot zone of a pulling-up machine 11 for modeling from the start of pulling up a single crystal 14 from a melt 12 by the pulling-up machine 11 to the completion of cooling the single crystal 14; a second step of classifying mesh points according to individual members of the hot zone, assigning to mesh points classified to a given member a property value peculiar to the member, determining the pulled-up length of the single crystal 14 at a given time, and the pulling-up speed of the single crystal 14 at that time, and sending the data to a computer; a third step of determining the distribution of temperatures over the surface of the members of hot zone based on the heat amount generated by a heater and the radiation rate of the members; a fourth step of determining the distribution of internal temperatures of the members of hot zone by solving a heat conduction equation based on the distribution of temperatures over the surface of the members, and their heat conductivities, and then solving an eddy current model equation in conjunction with a Navier-Stokes equation assuming that the melt 12 includes eddy currents, thereby determining the distribution of internal temperatures of the melt 12 with due consideration paid to convention currents in the melt 12; a fifth step of determining the shape of the solid-liquid interface between the single crystal 14 and the melt 12 along isothermal lines including a tri-junction S; a sixth step of repeating steps 3 to 5 until the tri-junction S is heated equal to or above the melting point of single crystal 14, determining the distribution of internal temperatures of the pull-up machine 11, gathering, for each mesh point of single crystal 14, its coordinates and temperature, and transmitting the data to the computer; a seventh step of altering stepwise the pulled-up length and height of single crystal 14, repeating steps 1 to 6, determining the distribution of internal temperatures of the pull-up machine 11, gathering, for each mesh point of single crystal 14, its coordinates and temperature, and transmitting the data to the computer; an eighth step of dividing, at specified intervals, the period from a time when the single crystal 14 is pulled up from the melt 12 to a time when the single crystal 14 completes a cooling process, gathering, for each mesh point of single crystal 14, its coordinates and temperature obtained by step 7 for each interval, and determining the distribution of internal temperatures of single crystal 14 in terms of the pulled-up length and height of single crystal 14; a ninth step of determining the distribution of densities of air holes and inter-lattice atoms within single crystal 14 accumulated during the time elapsed up to a given time interval by solving the diffusion equation based on the diffusion coefficients and boundary conditions of the air holes and inter-lattice atoms; a tenth step of determining the temperature at which voids 21 start to form based on the distribution of densities of air holes; an eleventh step of determining the density of voids 21 for each mesh point of single crystal 14 when the temperature is gradually lowered until it becomes equal to or below the temperature at which voids 21 start to form; a twelfth step of determining the radius of voids 21 for each mesh point of single crystal 14 when the temperature is below the temperature at which voids 21 start to form; a thirteenth step of determining the temperature at which inner wall oxide membrane 22 starts to grow around void 21; a fourteenth step of determining the radius of voids 21 and the thickness of inner wall oxide membrane 22 when the temperature is gradually lowered below the temperature at which inner wall oxide membrane 22 starts to grow, and relating the radius of void 21 with the thickness of inner wall oxide membrane 22; and a fifteenth step of repeating steps 8 to 14 until the cooling of single crystal 14 is completed.

According to the simulation method described in Claim 1, it is possible to precisely predict the distribution of densities and sizes of void defects comprising voids 21 and inner wall oxide membranes 22 within a single crystal 14, because the method determines the distribution of temperatures in a single crystal 14 growing from a melt 12 with due consideration paid to convention currents in the melt 12, and further determines the distribution of temperatures in the single crystal 14 during a cooling process, that is, analyzes it with due consideration paid to the effect of slow and rapid cooling of the single crystal 14 separated from the melt 12 in the cooling process.

As shown in FIGS. 5 to 10, another aspect of the invention described in Claim 2 relates to a computer-based simulation method for predicting the distribution of densities and sizes of oxygen precipitation nuclei in a single crystal, the method comprising: a first step of applying a mesh onto each member in a hot zone of a pulling-up machine 11 for modeling from the start of pulling up a single crystal 14 from a melt 12 by the pulling-up machine 11 to the completion of cooling the single crystal 14; a second step of classifying mesh points according to individual members and reactants of the hot zone, assigning to mesh points classified to a given member a property value peculiar to the member, determining the pulled-up length of the single crystal 14 at a given time, and the pulling-up speed of the single crystal 14 at that time, and sending the data to a computer; a third step of determining the distribution of temperatures over the surface of the members based on the heat amount generated by a heater and the radiation rate of the members; a fourth step of determining the distribution of internal temperatures of the members of hot zone by solving a heat conduction equation based on the distribution of temperatures over the surface of the members, and their heat conductivities, and then solving an eddy current model equation in conjunction with a Navier-Stokes equation assuming that the melt 12 includes eddy currents, thereby determining the distribution of internal temperatures of the melt 12 with due consideration paid to convention currents in the melt 12; a fifth step of determining the shape of the solid-liquid interface between the single crystal 14 and the melt 12 along isothermal lines including a tri-junction S; a sixth step of repeating steps 3 to 5 until the tri-junction S is heated equal to or above the melting point of single crystal 14, determining the distribution of internal temperatures of pulling-up machine 11, gathering, for each mesh point of single crystal 14, its coordinates and temperature, and transmitting the data to the computer; a seventh step of altering stepwise the pulled-up length and height of single crystal 14, repeating steps 1 to 6, determining the distribution of internal temperatures of pulling-up machine 11, gathering, for each mesh point of single crystal 14, its coordinates and temperature, and transmitting the data to the computer; an eighth step of dividing, at specified intervals, the period from a time when the single crystal 14 is pulled up from the melt 12 to a time when the single crystal 14 completes a cooling process, gathering, for each mesh point of single crystal 14, its coordinates and temperature obtained by step 7 for each interval, and determining the distribution of internal temperatures of single crystal 14 in terms of the pulled-up length and height of single crystal 14; a ninth step of determining the distribution of densities of air holes and inter-lattice atoms within single crystal 14 accumulated during the time elapsed up to a given time interval by solving the diffusion equation based on the diffusion coefficients and boundary conditions of the air holes and inter-lattice atoms; a tenth step of determining the temperature at which voids 21 start to form based on the distribution of densities of air holes; an eleventh step of determining the density of voids 21 for each mesh point of single crystal 14 when the temperature is gradually lowered until it becomes equal to or below the temperature at which voids 21 start to form; a twelfth step of determining the radius of voids 21 for each mesh point of single crystal 14 when the temperature is below the temperature at which voids 21 start to form; a thirteenth step of determining the temperature at which inner wall oxide membrane 22 starts to grow around void 21; a fourteenth step of determining the radius of voids 21 and the thickness of inner wall oxide membrane 22 when the temperature is gradually lowered below the temperature at which inner wall oxide membrane 22 starts to grow, and relating the radius of void 21 with the thickness of inner wall oxide membrane 22; a fifteenth step of determining the incidence of oxygen precipitation nuclei per unit time and the critical radius of the nuclei based on the distribution of densities of oxygen, of densities of air holes, and of temperatures within single crystal 14; a sixteenth step of terminating, when the per-unit-time incidence of oxygen precipitation nuclei exceeds zero, computation for determining the radius of voids 21 and thickness of inner wall oxide membrane 22, and determining the radius of oxygen precipitation nuclei; and a seventeenth step of repeating steps 8 to 16 until the single crystal 14 completes cooling process.

According to the simulation method described in Claim 2, it is possible to precisely predict the distribution of densities and sizes of oxygen precipitation nuclei within a single crystal 14, because the method determines not only the distribution of temperatures in a single crystal 14 growing from a melt 12 with due consideration paid to convention currents in the melt 12, but also the distribution of temperatures in the single crystal 14 during the cooling process. More specifically, the method determines the distribution of densities and sizes of void defects comprising voids 21 and inner wall oxide membranes 22 within a single crystal 14 with due consideration paid to the effect of slow and rapid cooling during the cooling process to which the single crystal 14 is subjected after it is separated from melt 12, determines the incidence per unit time of oxygen precipitation nuclei and their critical radius, terminates, when the per-unit-time incidence of oxygen precipitation nuclei exceeds zero, computation for determining the radius of voids and thickness of inner wall oxide membrane 22, and determines instead the radius of oxygen precipitation nuclei. The method thus allows a precise prediction of the distribution of densities and sizes of oxygen precipitation nuclei within a single crystal 14.

The critical radius of an oxygen precipitation nucleus mentioned herein refers to the minimum radius of an oxygen precipitation nucleus developed during the growth of a crystal. The critical radius is determined dependent on the oversaturated density of air holes and oversaturated density of oxygen.

Effect of the Invention

As described above, the inventive method determines with the aid of a computer not only the distribution of temperatures within a single crystal growing from a melt with due consideration paid to convection currents in the melt, but also the distribution of temperatures in the single crystal during the cooling process, specially, with due consideration of the effect of slow and rapid cooling during the cooling process of the single crystal separated from the melt, and determines the distribution of voids in the single crystal using a computer, and then relates the radius of void with the thickness of inner wall oxide membrane formed around the void using a computer. Accordingly, it is possible to precisely predict the distribution of densities and sizes of void defects comprising voids and inner wall oxgen membranes in a single crystal.

Furthermore, the method makes it possible to precisely predict the distribution of densities and sizes of oxygen precipitation nuclei in a single crystal by determining not only the distribution of temperatures within a single crystal growing from a melt with convection currents of the melt considered with using a computer, but also the distribution of temperatures within the single crystal during a cooling process. That is, the method determines the distribution of densities and sizes of void defects comprising voids and inner wall oxide membranes, and determines the incidence per unit time of oxygen precipitation nuclei and the critical radius of those nuclei, terminates, when the per-unit-time incidence of oxygen precipitation nuclei exceeds zero, computation for determining the radius of voids and thickness of inner wall oxide membrane, and determines the radius of oxygen precipitation nuclei using the computer. Thus, it is possible to precisely predict the distribution of densities of oxygen precipitation nuclei within a single crystal by determining the incidence per unit time of oxygen precipitation nuclei therein, and it is also possible to precisely predict the distribution of sizes of oxygen precipitation nuclei within a single crystal by determining the radius of oxygen precipitation nuclei therein.

BEST MODE FOR CARRYING OUT THE INVENTION

Next, a first embodiment of the present invention will be described below with reference to the attached drawings.

As shown in FIG. 5, in the chamber of a silicon single crystal pulling-up machine 11, there is provided a quartz crucible 13 for storing a silicon melt 12. The quartz crucible 13 is connected via a graphite susceptor and supporting axis (not shown) to a crucible moving means which moves the quartz crucible 13 upward or downward while rotating it. Around the quartz crucible 13 there is provided a heater (not shown) by a specified distance apart from the quartz crucible 13. The heater is surrounded by a heat-insulating cylinder (not shown). The heater heats a highly pure silicon polycrystal put into quartz crucible 13 to turn it into a silicon melt 12. Onto the upper end of the chamber a cylindrical casing (not shown) is joined, and the pulling-up means is attached to the casing. The pulling-up machine is so designed as to pull up a silicon single crystal 14 while rotating it.

The simulation method for predicting the distribution of densities and sizes of void defects in a silicon single crystal 14 prepared by the silicon single crystal pulling-up machine 11 having a configuration as described above will be described with reference to FIGS. 1 to 6.

At a first step, the simulation system applies a mesh onto each member in a hot zone of a silicon single crystal pulling-up machine 11 for modeling, where a silicon single crystal 14 having a specified length $L_1$ (e.g., 100 mm) is pulled up, such as the chamber, quartz crucible 13, silicon melt 12, silicon single crystal 14, graphite susceptor, and heat-insulating cylinder for modeling. More specifically, for each member in the hot zone, the coordinates of relevant mesh points are fed to a computer. Among the mesh spread over silicon melt 12, those arranged in the transverse direction of the silicon single crystal 14 and totally or partially beneath the silicon single crystal 14 (transverse mesh hereinafter) has a size of 0.01 to 5.00 mm, more preferably 0.25 to 1.00 mm. Among the mesh spread over silicon melt 12, those arranged in the longitudinal direction of the silicon single crystal 14 and totally or partially separated from the silicon single crystal 14 (longitudinal mesh hereinafter) has a size of 0.01 to 5.00 mm, more preferably 0.1 to 0.5 mm.

The transverse mesh is set to have a size of 0.01 to 5.00 mm. This is because if the lower limit is below 0.01 mm, computation will require an undue long time and if the upper limit is over 5.00 mm, computation will become so unstable that it can not give a definitive answer for the shape of solid-liquid interface even when repeated as desired. The longitudinal mesh is set to have a size of 0.01 to 5.00 mm. This is because if the lower limit is below 0.01 mm, computation will require an undue long time and if the upper limit is over 5.00 mm, computation will give an answer divergent from the one obtained by measurement as to the shape of solid-liquid interface. If it is necessary to apply the above size limit of 0.01 to 5.00 mm to a certain fraction of transverse mesh, of the mesh beneath the silicon single crystal 14, those around the periphery of silicon single crystal 14 should be preferably selected to have that size limit. If it is necessary to apply the above size limit of 0.01 to 5.00 mm to a certain fraction of longitudinal mesh, the mesh of silicon melt 12 at the surface of melt or at the bottom surface of crucible should be preferably selected to have that size limit.

As a second step, the simulation system classifies the mesh points according to individual members and reactants of the hot zone, assigns to mesh points classified to a given member a property value peculiar to the member, and sends the data to a computer. For example, if the chamber is made of stainless steel, the simulation system assigns, to each mesh point related with the chamber, heat conductivity, radiation rate, viscosity, thermal expansion coefficient, density, specific heat capacity, etc. of stainless steel, and sends the data to a computer. In addition, the simulation system delivers to the computer data such as the pulled-up length of silicon single crystal 14 at a given time, pulling-up speed of silicon single crystal 14 at that time, and eddy current parameter C obtained from eddy current model equation (1) described below.

As a third step, the simulation system determines, with the aid of the computer, the distribution of temperatures over the surface of the members of hot zone based on the heat amount generated by the heater and the radiation rate of the members. The simulation system sets a desired heat amount and feeds it to the computer, and instructs the computer to determine the distribution of temperatures over the surface of the members based on that heat amount generated by the heater and the radiation rate of the members. Then, at a fourth step, the simulation system solves, with the aid of the computer, heat conduction equation (1) based on the distribution of temperatures over the surface of the members of hot zone and the heat conductivities of those members, thereby determining the distribution of internal temperatures of the members. For the simplicity of description, the equation is written on the assumption that the pulling-up machine is placed in an XYZ orthogonal coordinate system. In reality, however, computation is performed on the assumption that the pulling-up machine is placed in a polar coordinate system.

Formula 1

$$\rho c \frac{\partial T}{\partial t} = \frac{\partial}{\partial t}\left[\lambda_x \frac{\partial T}{\partial x}\right] + \frac{\partial}{\partial y}\left[\lambda_y \frac{\partial T}{\partial y}\right] + \frac{\partial}{\partial z}\left[\lambda_z \frac{\partial T}{\partial z}\right] + q \quad (1)$$

In equation (1), $\rho$ represents the density of a member, c the specific heat capacity of the member, T the absolute temperature of a given mesh point in the member, and t time. $\lambda_x$, $\lambda_y$, and $\lambda_z$ represent the x-, y- and z-components of the heat conductivity of the member, respectively, and q heat amount generated by the heater.

The simulation system also obtains the distribution of temperatures within silicon melt 12 by means of the heat conduction equation (1) described above, and determines, with the aid of the computer, the distribution of flow velocities within silicon melt 12 based on the distribution of internal temperatures thereof, by solving eddy current model equation (2) in conjunction with Navier-Stokes equations (3) to (5) assuming that the silicon melt 12 includes eddy currents.

Formula 2

$$\kappa_t = \frac{c}{Pr_t} \times \rho \times C \times d\sqrt{k} \quad (2)$$

In equation (2), $\kappa_t$ represents the heat conductivity of eddy currents of silicon melt 12, c the specific heat capacity of silicon melt 12, $Pr_t$ the Prandtl number, $\rho$ the density of silicon melt 12, C eddy current parameter, d the distance from the wall of quartz crucible 13 storing silicon melt 12, and k the root mean square of variable components relative to the average flow velocity of silicon melt 12.

Formula 3

$$\frac{\partial u}{\partial t} + u\frac{\partial u}{\partial x} + v\frac{\partial u}{\partial y} + w\frac{\partial u}{\partial z} = \quad (3)$$
$$-\frac{1}{\rho}\frac{\partial p}{\partial x} + (v_1 + v_t)\left[\frac{\partial^2 u}{\partial x^2} + \frac{\partial^2 u}{\partial y^2} + \frac{\partial^2 u}{\partial z^2}\right] + \frac{F_x}{\rho}$$

$$\frac{\partial v}{\partial t} + u\frac{\partial v}{\partial x} + v\frac{\partial v}{\partial y} + w\frac{\partial v}{\partial z} = \quad (4)$$
$$-\frac{1}{\rho}\frac{\partial p}{\partial y} + (v_1 + v_t)\left[\frac{\partial^2 v}{\partial x^2} + \frac{\partial^2 v}{\partial y^2} + \frac{\partial^2 v}{\partial z^2}\right] + \frac{F_y}{\rho}$$

$$\frac{\partial w}{\partial t} + u\frac{\partial w}{\partial x} + v\frac{\partial w}{\partial y} + w\frac{\partial w}{\partial z} = \quad (5)$$
$$-\frac{1}{\rho}\frac{\partial p}{\partial z} + (v_1 + v_t)\left[\frac{\partial^2 w}{\partial x^2} + \frac{\partial^2 w}{\partial y^2} + \frac{\partial^2 w}{\partial z^2}\right] + \frac{F_z}{\rho}$$

In equations (3) to (5), u, v and w represent the x-, y- and z-components of the flow velocity of a given mesh point in silicon melt 12 respectively, $v_l$ the molecular dynamic viscosity index (property value) of silicon melt 12, $v_t$ the molecular dynamic viscosity index due to the eddy currents of silicon melt 12, and $F_x$, $F_y$ and $F_z$ the x-, y-, and z-components of the volume force acting on silicon melt 12.

The eddy current model equation (2) is also called the k1-model equation, and any desired number between 0.4 and 0.6 is preferably chosen as the eddy current parameter of this model equation. The reason why the eddy current parameter is chosen to be 0.4 to 0.6 lies in the fact that if a number beyond 0.6 or below 0.4 is chosen as the eddy current parameter, the shape of interface obtained from the equation will be divergent from the one obtained by measurement. The Navier-Stokes equations (3) to (5) cited above are equations of motion assuming that the silicon melt 12 is non-compressible and has a constant viscosity.

The simulation system performs a renewed calculation with the aid of the computer using the distribution of internal temperatures of silicon melt 12 determined as described below, and determines again the distribution of internal temperatures of silicon melt 12 by solving the heat energy equation (6) below with consideration being paid now to the convection currents within the silicon melt 12.

Formula 4

$$u\frac{\partial T}{\partial x} + v\frac{\partial T}{\partial y} + w\frac{\partial T}{\partial z} = \frac{1}{\rho c}(\kappa_1 + \kappa_t)\left[\frac{\partial^2 T}{\partial x^2} + \frac{\partial^2 T}{\partial y^2} + \frac{\partial^2 T}{\partial z^2}\right] \quad (6)$$

In equation (6), u, v and w represent the x-, y- and z-components of the flow velocity of a given mesh point in silicon melt 12 respectively, T the absolute temperature of the mesh point, $\rho$ the density of silicon melt 12, c the specific heat capacity of silicon melt 12, $\kappa_1$ its molecular heat conductivity, and $\kappa_t$ the heat conductivity of eddy currents obtained from equation (1).

Then at a fifth step, the simulation system determines, with the aid of the computer, the shape of the solid-liquid interface between silicon single crystal 14 and silicon melt 12 based on isothermal lines including a tri-junction S (tri-junction at which solid, liquid and gas coexist) shown in FIG. 5. At a sixth step, the simulation system alters (increases gradually) the heat amount generated by the heater to be fed to the computer. The simulation system repeats steps 3 to 5 until the tri-junction S is heated up to the melting point of silicon single crystal 14. Then, the simulation system determines the distribution of temperatures within the pulling-up machine 11, and seeks, for each mesh point of silicon single crystal, its coordinates and temperature. The data is fed to the computer for storage.

Then, at a seventh step, the simulation system allows the silicon single crystal 14 to be pulled up further by $\delta$ (e.g., 50 mm) in addition to the length $L_1$. The simulation system repeats steps 1 to 6, determines the distribution of temperatures within the pulling-up machine 11, and seeks, for each mesh point of silicon single crystal 14, its coordinates and temperature. The data is fed to the computer for storage. Operation at the seventh step starts when silicon single crystal 14 is elongated from $L_1$ to $L_2$ ($L_2$ is a length at which the silicon single crystal 14 is separated from silicon melt 12 (length of the single crystal when its growth is stopped)), and separated from silicon melt 12, and continues while the silicon single crystal 12 is further pulled up so that its height is extended from $H_1$ ($H_1$ is the distance from the shoulder of the straight body of silicon single crystal 14 to the surface of silicon melt 12 (FIG. 5)) to $H_2$ ($H_2$ is the distance from the shoulder of the straight body of silicon single crystal 14 to the surface of silicon melt 12 when cooling process is completed), that is, up to the time when the cooling of silicon single crystal is completed. Namely, once silicon single crystal 14 is separated from silicon melt 12, the simulation system allows silicon single crystal 14 to be pulled up further by $\delta$ (e.g., 50 mm), and repeats steps 1 to 6 as described above.

When the height of silicon single crystal 14 is extended from $H_1$ to $H_2$, operation shifts to the eighth step. At step 8, the simulation system divides the period t from a time $t_0$ when silicon single crystal 14 is pulled up from silicon melt 12 to a time $t_1$ when silicon single crystal 14 is separated from silicon melt 12 and has undergone cooling process at specified intervals or $\Delta t$ seconds (brief time intervals). At that time, the simulation system also feeds data such as the diffusion coefficients and boundary conditions of inter-lattice silicon atoms and air holes within silicon single crystal 14 and constants to be entered into the equations used for the computation of the distribution of densities and sizes of voids 21 and inner wall oxide membrane 22 (FIG. 6) to the computer. The simulation system gathers, for each mesh point of silicon single crystal 14, its coordinates and temperature obtained at step 7 for each interval $\Delta t$, and determines the distribution of internal temperatures of silicon single crystal 14 in terms of the pulled-up length $L_1$ and pulled-up height $H_1$ of silicon single crystal 14.

The simulation system determines for each mesh point of silicon single crystal 14 its coordinates and temperature at every incremental length $\delta$ at steps 1 to 7. Provided that the pulled-up length $L_1$ and pulled-up height $H_1$ of silicon single crystal 14 are reached $\Delta t$ sec after $t_0$, the simulation system determines the distribution of internal temperatures of silicon single crystal 14 at that time interval. Next, the simulation system determines the distribution of densities of air holes and inter-lattice atoms within silicon single crystal 14 accumulated during the time elapsed up to $\Delta t$ sec by solving the diffusion equation based on the diffusion coefficients of air holes and inter-lattice silicon atoms in silicon single crystal 14 and their boundary conditions (ninth step).

Specifically, the equation necessary for computing the density $C_v$ of air holes is represented by equation (7) below, and the equation necessary for computing the density $C_i$ of inter-lattice silicon atoms is represented by equation (8) below. For equations (7) and (8), it is assumed that thermal equilibrium among air holes and among inter-lattice silicon atoms is maintained all over the surface of the silicon single crystal, in order to facilitate the computation of density $C_v$ and density $C_i$ over time.

Formula 5

$$C_{ve} = K_1 \exp\left[-\frac{E_v}{k_B T}\right] \quad (7)$$

$$C_{ie} = K_2 \exp\left[-\frac{E_i}{k_B T}\right] \quad (8)$$

In equations (7) and (8), $K_1$ and $K_2$ are constants, $E_i$ and $E_v$ formation energy of inter-lattice silicon atoms and air holes respectively, $C_{ve}$ and $C_{ie}$ equilibrium densities of air holes and inter-lattice silicon atoms respectively, $K_B$ Boltzman's constant, and T absolute temperature.

The above equilibrium equations can be made differentials over time, to give following equations (9) and (10) for air holes and inter-lattice silicon atoms respectively.

Formula 6

$$\frac{dC_v}{dt} = \nabla(D_v \nabla C_v) - \nabla\left[\frac{E_v^t}{k_B T^2} D_v C_v \nabla T\right] - k_{iv}(T)\{C_i C_v - C_{ie}(T)C_{ve}(T)\} - \Theta(T_v - T)\Theta(T - T_P)(C_v - C_{ve})N_v \times 4\pi r_v D_v(C_v - C_{ve}) - \Theta(T_p - T)\Theta(C_v - C_{ve})N_p \times 4\pi R_P \times \frac{D_v(C_v - C_{ve})}{1 + \frac{D_v}{g_v R_p}} \quad (9)$$

$$\frac{dC_i}{dt} = \nabla(D_i \nabla C_i) - \nabla\left[\frac{E_i^t}{k_B T^2} D_i C_i \nabla T\right] - k_{iv}(T)\{C_i C_v - C_{ie}(t)C_{ve}(T)\} - \Theta(T_v - T)\Theta(T - T_p)\Theta(C_i - C_{ie})N_v \times 4\pi r_v D_i(C_i - C_{ie}) \quad (10)$$

In equations (9) and (10), $\Theta(x)$ represents a Heaviside function. Namely, when $x<0$, $\Theta(x)=0$, and when $x>0$, $\Theta(x)=1$. $T_p$ represents the temperature at which the inner wall oxide membrane 22 (silicon oxide ($SiO_x$) membrane developed on the surface of void 21) starts to form. $T_v$ represents the temperature at which void 2first starts to form (FIG. 6). The first term of the right hand side of equations (9) and (10) is the same with the Fick's diffusion equation. $D_v$ and $D_i$ in the first term represent the diffusion coefficients of air holes and inter-lattice silicon atoms respectively which are represented by following equations (11) and (12).

Formula 7

$$D_v = d_v \exp\left[-\frac{\Delta E_v}{k_B T}\right] \quad (11)$$

$$D_i = d_i \exp\left[-\frac{\Delta E_i}{k_B T}\right] \quad (12)$$

In equations (11) and (12), $\Delta E_v$ and $\Delta E_i$ represent activation energies of air holes and inter-lattice silicon atoms, $d_v$ and $d_i$ constants peculiar to voids and inter-lattice silicon atoms respectively. In addition, $E_v^t$ and $E_i^t$ in the second term of the right hand side of equations (9) and (10) represent activation energies of air holes and inter-lattice silicon atoms respectively. $k_{iv}$ in the third term of the right hand side of equations (9) and (10) represents a recombination constant of air holes as well as of inter-lattice silicon pairs. $N_v$ in the fourth term of the right hand side of equations (9) and (10) represents the density of voids 21, and $r_v$ in the same term represents the radius of voids 21. $N_p$ in the fifth term of the right hand side of equation (9) represents the density of inner wall oxide membrane 22, and $R_p$ in the same term the outer radius of inner wall oxide membrane 22.

Equation (9) applies for the case where each flux of air holes responsible for the precipitation of air holes is sufficiently large, and the difference in volume per unit mass between Si matrix and $SiO_x$ constituting inner wall oxide membrane both contributing to the formation of silicon single crystal 14 can be accounted for by voids, that is, $\gamma D_0 C_0 \leq D_v(C_v - C_{ve})$. For the cases other than the above case, following equation (13) will apply. Here, $\gamma$ represents the consumed fraction of an air hole for one oxygen atom, $D_0$ the diffusion coefficient of oxygen, and $C_0$ the density of oxygen.

Formula 8

$$\frac{dC_v}{dt} = \nabla(D_v \nabla C_v) - \nabla\left[\frac{E_v^t}{kT^2} D_v C_v \nabla T\right] - k_{iv}(T)\{C_i C_v - C_{ie}(T)C_{ve}(T)\} - \Theta(T_v - T)\Theta(T - T_p)\Theta(C_v - C_{ve})N_v \times 4\pi r_v D_v(C_v - C_{ve}) - \Theta(C_v - C_{ve})\Theta(T_p - T) \times 4\pi R_p N_p \times \frac{D_v(C_v - C_{ve})}{1 + \frac{D_v}{g_v R_p}} \quad (13)$$

In equation (13), $\Theta(x)$ represents a Heaviside function. Namely, when $x<0$, $\Theta(x)=0$, and when $x>0$, $\Theta(x)=1$. $T_p$ represents the temperature at which the inner wall oxide membrane 22 starts to form. $T_v$ represents the temperature at which void 2first starts to form. The first term of the right hand side of equation (13) is the same with the Fick's diffusion equation. $D_v$ in the first term represents the diffusion coefficients of air holes which are represented by equation (11).

Then, at step 10, the simulation system determines the temperature $T_v$ at which voids 2first start to form by solving equation (14) below based on the distribution of densities $C_v$ of air holes obtained from the above diffusion equation.

Formula 9

$$T_v^{3/2}[k_B^{3/2}\ln(C_v/C_{v0}) - k_B^{1/2} E_v/T_m] + T_v^{1/2} k_B^{1/2} \cdot 2E_v = 0.68\sigma_v^{3/2}/\rho \quad (14)$$

In equation (14), $C_v$ represents the density of air holes in silicon single crystal 14, $C_{v0}$ the equilibrium density of air holes at the melting point $T_m$ of silicon single crystal 14, and $E_v$ the formation energy of air holes. $\sigma v$ represents the interface energy of silicon single crystal 14 at a crystal surface (111), $\rho$ the density of silicon single crystal 14, and $k_B$ Boltzman constant.

At step 11, the simulation system determines the density $N_v$ of voids 21 using approximation (15) below observed when the temperature is gradually lowered until it becomes equal to or below the void formation temperature $T_v$.

Formula 10

$$N_v \approx n_v (dT/dt)^{3/2} (D_v k_B T^2)^{-3/2} (C_v)^{-1/2} \quad (15)$$

In equation (15), n represents the density of voids 21, and (dT/dt) the cooling speed of silicon single crystal 14. The density of voids 21, although it may vary somewhat depending on the saturation degree of air holes, can be safely regarded constant as long as the temperature is limited to the range at which voids can be formed in the silicon single crystal 14 under study. $D_v$ represents the diffusion coefficient of voids 21, $k_B$ Boltzman constant, and $C_v$ the density of air holes in silicon single crystal 14.

At step 12, the simulation system determines, for each qmesh point of silicon single crystal 14, the radius $r_v$ of voids when the temperature is below the void formation temperature $T_v$ by means of equation (16) below. It should be noted here that the growth speed of voids 21 depends on the diffusion speed of air holes. It should be noted further that, although the void has an octahedron form in reality, the equation assumes that the void has a spherical form.

Formula 11

$$r_v = \left[\frac{2}{\rho}\int_{t1}^{t}\{\Theta(C_v - C_{ve})D_v(C_v - C_{ve}) - \Theta(C_i - C_{ie})D_i(C_i - C_{ie})\}dt' + r_{vcr}^2\right]^{1/2} \quad (16)$$

In equation (16), t1 represents the time at which the temperature of a given mesh point of silicon single crystal 14 is down to the void formation temperature $T_v$. $r_{ver}$ represents the critical radius of void 21. The critical radius of void $r_{ver}$ is equal to the radius of voids 21 observed at time t1. $C_{ve}$ and $C_{ie}$ represent the equilibrium densities of air holes and inter-lattice silicon atoms respectively.

Next at step 13, the simulation system determines the temperature at which an inner wall oxide membrane 22 starts to grow around a void 21. If the temperature $T_p$ of formation of inner wall oxide membrane 22 is lower than the temperature $T_v$ of formation of voids 21, oxygen binds to air hole, and oxide membrane 22 grows on the internal wall of the void 21 (FIG. 6). According to the model of the invention, it is assumed that oxide membrane 22 grows soon after the formation of a void 21. The term "soon" used here means a "time interval between the formation of the void and the next round of computation." Accordingly, the temperature $T_p$ of formation of inner wall oxide membrane 22 is the same with the temperature $T_v$ of void formation.

At step 14, the simulation system determines the radius $r_v$ of voids 21 and the thickness d of inner wall oxide membrane 22 when the temperature is lowered below the membrane formation temperature $T_p$, and relates the radius $r_v$ of void 21 with the thickness d of inner wall oxide membrane 22. Generally, oxygen diffuses and reacts with silicon to form a membrane 22 over the internal wall of a void. Assume oxygen approaches from outside an inner wall oxide membrane 22 having a radius of Rp with the center of the sphere being at the original point of a coordinate system. Then, the flux $J_O$ of oxygen can be obtained from equation (17) below.

Formula 12

$$J_O = 4\pi R_P D_O(C_O - C_{Oeif})/\{1 + D_O/(g_O R_P)\} \quad (17)$$

In equation (17), $D_O$ represents the diffusion coefficient of oxygen, $C_O$ the density of oxygen, $C_{Oeif}$ the equilibrium density of oxygen in a spherical void 21 having a radius of $R_P$ with its center correspondent with the original point of a coordinate system, and $g_O$ the fraction of oxygen atoms involved in reaction at the interface between $SiO_x$ and Si on the external surface of the sphere, that is, at the outer surface of inner wall oxide membrane 22 there.

The flux $J_v$ of air holes flowing from outside into the outer surface of inner wall oxide membrane 22 (surface of a sphere having a radius $R_P$) can be determined by means of equation (18) below.

Formula 13

$$J_v = 4\pi R_P D_v(C_v - C_{veif})/\{1 + D_v/(g_v R_P)\} \quad (18)$$

In equation (18), $g_v$ represents the fraction of air holes involved in reaction at the outer surface of inner wall oxide membrane 22, and $C_{veif}$ the equilibrium density of air holes at the outer surface of inner wall oxide membrane 22. As inner wall oxide membrane 22 grows, more air holes are consumed. The fraction of an air hole consumed by an oxygen atom is $\gamma$. If a void has a flux of $\gamma J_O$ with respect to the flux $J_O$ of oxygen, then inner wall oxide membrane 22 will grow smoothly with no distortion. Then, the flux $\gamma J_O$ of a void can be determined from equation (19) below.

Formula 14

$$\gamma J_O = 4\pi\gamma R_P D_O(C_O - C_{Oeif})/\{1 + D_O/(g_O R_P)\} \quad (19)$$

Thus, $(J_v - \gamma J_O)$ represents the flux of air holes absorbed by inner wall oxide membrane 22. If the flux of air holes from outside to inner wall oxide membrane 22 increases $((J_v - \gamma J_O) > 0)$, or if the flux of air holes from inside the void to inner wall oxide membrane 22 over time increases $((J_v - \gamma J_O) < 0)$, and the fraction of variations of flux over time is $\alpha$, $\alpha$ will be determined by the thickness of inner wall oxide membrane 22. If inner wall oxide membrane 22 has a thickness d, that is, $(R_P - r_v) < d_0$, inner wall oxide membrane 22 will receive air holes from inside the void as well as from outside. In other words, if $d < d_0$ and $\alpha \neq 0$, a certain fraction of air holes will penetrate through inner wall oxide membrane 22 to participate in the growth of void 21. However, as soon as oxygen precipitation layers turn into oxygen precipitation nuclei, inter-lattice silicon atoms will not be used for the growth of voids 21.

If the flux of air holes from outside to inner wall oxide film 22 is small, that is, $(J_v - \gamma J_O) < 0$, it will not be possible to grow inner wall oxide membrane 22 with no distortion. Then, air holes enter the oxide membrane from inside void 21, and the external diameter of void 21 shrinks. As a consequence, if $d \geq d_0$ and $\alpha = 0$, inner wall oxide membrane 22 will be completely impermeable to air holes. If the number of air holes within a void 21 is n, dn/dt is the inflow of air holes. If $dn/dt = \alpha(J_v - \gamma J_O)$, equation (20) will be obtained. In equation (20), $r_v$ represents the radius of void 21 obtained from equation (16), and $R_P$ the outer radius of inner wall oxide membrane 22. $D_O$ represents the diffusion coefficient of oxygen, and $C_O$ the density of oxygen. $C_{Oeif}$ the equilibrium density of oxygen in a spherical void 21 having a radius of $R_P$ with its center correspondent with the original point of a coordinate system; and $g_O$ the fraction of oxygen atoms involved in reaction at the outer surface of inner wall oxide membrane Formula 15

$$r_v^2 \times \frac{dr_v}{dt} = \alpha\rho^{-1}R_P\left[\frac{D_v(C_v - C_{veif})}{1 + \frac{D_v}{g_v R_P}} - \gamma\frac{D_O(C_O - C_{Oeif})}{1 + \frac{D_O}{g_O R_P}}\right] \quad (20)$$

Since the number of $SiO_x$ molecules constituting inner wall oxide membrane 22 varies depending on the consumption of the flux $J_O$ of oxygen coming from outside to the inner wall oxide membrane 22 which is determined by equation (20), equation (21) below will be obtained. In equation (21), $\rho_P$ is defined to be $\rho_P = x/(\Omega SiO_x)$, and its unit is molecular weight/density. $\Omega$ is a constant correspondent with x of $SiO_x$.

Formula 16

$$R_P \times \frac{dR_P}{dt} - \frac{r_v^2}{R_P} \times \frac{dr_v}{dt} = \frac{1}{\rho_P} \times \frac{D_O(C_O - C_{Oeif})}{1 + \frac{D_O}{g_O R_P}} \quad (21)$$

When equation (21) is entered into equation (20), equation (22) below is obtained. In equation (22), $\eta$ is $\Omega_{SiOx}/\Omega_{Si}$. In this definition of $\eta$, $\Omega_{si}$ is $1/\rho$, and $\rho$ represents the density of silicon single crystal 14.

Formula 17

$$R_p \times \frac{dR_p}{dt} = \rho^{-1}\left[\frac{\alpha D_v(C_v - C_{veif})}{1 + \frac{D_v}{g_v R_p}} + \left(\frac{\eta}{x} - \alpha\gamma\right)\frac{D_O(C_O - C_{Oeif})}{1 + \frac{D_O}{g_O R_O}}\right] \quad (22)$$

The following is known from equations (20) and (22). First, when the time at which d is equal to $d_0$ is $t_3$, $\alpha=0$ at $t_3$, and thus inner wall oxide membrane 22 becomes impermeable then. If it is assumed that the outer diameter of void 21 is fixed and equal to $r_v(t_3)$, the growth of inner wall oxide membrane 22 is determined solely by the consumption of air holes and oxygen coming from the matrix of silicon single crystal 14. Namely, when $(J_v-\gamma J_0)>0$, equation (22) will become equation (23) below, while when $(J_v-\gamma J_0)<0$, equation (22) will become equation (24) below.

Formula 18

$$R_p \times \frac{dR_p}{dt} = \frac{\eta}{\rho x} \times \frac{D_O(C_O - C_{Oeif})}{1 + \frac{D_O}{g_O R_p}} \quad (23)$$

$$= \frac{\Omega_{SiOx}}{x} \times \frac{D_O(C_O - C_{Oeif})}{1 + \frac{D_O}{g_O R_p}}$$

$$R_p \times \frac{dR_p}{dt} = \frac{\Omega_{SiOx}}{\gamma x} \times \frac{D_v(C_v - C_{veif})}{1 + \frac{D_v}{g_v R_p}}. \quad (24)$$

In equations (23) and (24), $\Omega_{SiOx}$ represents the molecular volume of $SiO_x$. Equations (23) and (24) assume that the equilibrium density of air holes around the outer wall of inner wall oxide membrane is independent of $R_p$, and that $C_{veif}=C_{ve}$ and $C_{Oeif}=C_{Oe}$. It is possible to determine the thickness d of inner wall oxide membrane 22 by determining the outer radius $R_P$ of inner wall oxide membrane 22 from equation (23) or (24), and subtracting the radius $r_v$ of void 21 from the outer radius $R_P$ thus obtained. The simulation system repeats steps 8 to steps 14 described above until the cooling of silicon single crystal is completed (step 15). For this purpose, the simulation system uses equations (9) to (24) interchangeably with each other with the aid of the computer.

As described above, the simulation system determines the distribution of internal temperatures of silicon single crystal 14 growing from silicon melt 12 with due consideration paid to convection currents of silicon melt 12. Then, the system deals with silicon single crystal separated from silicon melt 12, and undergoing cooling process, and undertakes a similar analysis considering the pulling-up speed of silicon single crystal 14 after it is separated from melt 12, and the cooling process consisting of slow and rapid cooling phases. Thus, it is possible to precisely predict the distribution of densities and sizes of void defects comprising voids 21 and oxide membranes 22 attached to the inner wall of voids within a silicon single crystal 14. As a consequence, it becomes possible to design the structure of a pulling-up machine 11 such that a silicon single crystal 14 pulled up by the machine from a silicon melt 12 has a desired distribution of densities and sizes of void defects.

FIGS. 7 to 10 illustrate a second embodiment of the invention.

According to this embodiment, steps 1 to 14 are almost the same with those of the first embodiment except that equation (9) of the first embodiment is replaced with equation (9)' in the second embodiment. In equation (9)', $D_O$ represents the diffusion coefficient of oxygen, and $C_O$ the density of oxygen at a temperature at which oxygen precipitation nuclei are formed. $J_c$ represents the amount of oxygen precipitation nuclei having a critical radius generated during a unit time, and $r_c$ the radius of oxygen precipitation nuclei.

Formula 19

$$\frac{dC_v}{dt} = \quad (9)'$$

$$\nabla(D_v \nabla C_v) - \nabla\left[\frac{E_v^t}{k_B T^2}D_v C_v \nabla T\right] - k_{iv}(T)\{C_i C_v - C_{ie}(T)C_{ve}(T)\} -$$

$$\Theta(T_v - T)\Theta(T - T_P)(C_v - C_{ve})N_v \times 4\pi r_v D_v(C_v - C_{ve}) -$$

$$\Theta(T_p - T)\Theta(C_v - C_{ve})N_p \times 4\pi R_p \times \frac{D_v(C_v - C_{ve})}{1 + \frac{D_v}{g_v R_p}} -$$

$$\gamma \times 4\pi D_O C_O \int J_c(t')r_c(t, t')dt'$$

Equation (9)' applies for the case where each flux of air holes responsible for the precipitation of air holes is sufficiently large, and the difference in volume per unit mass between Si matrix and $SiO_x$ constituting inner wall oxide membrane both contributing to the formation of silicon single crystal 14 can be accounted for by voids, that is, $\gamma D_0 C_0 \leq D_v(C_v - C_{ve})$. For the cases other than the above case, following equation (13) will apply. Here, $\gamma$ represents the fraction of an air hole for one oxygen atom which allows the distortion-free production of oxide, and depends on the phase of oxygen precipitation nuclei. When oxygen precipitation nuclei are made of $SiO_2$, $\gamma \approx 0.5$, and when they are made of SiO, $\gamma \approx 0.65$. $D_0$ represents the diffusion coefficient of oxygen, and $C_0$ the density of oxygen at a temperature at which oxygen precipitation nuclei are formed.

Equation (13) of the first embodiment is replaced with equation (13)' below. In equation (13)', $J_c$ represents the amount of oxygen precipitation nuclei having a critical radius generated during a unit time length, and $r_c$ the radius of oxygen precipitation nuclei.

Formula 20

$$\frac{dC_v}{dt} = \quad (13)'$$

$$\nabla(D_v \nabla C_v) - \nabla\left[\frac{E_v^t}{kT^2}D_v C_v \nabla T\right] - k_{iv}(T)\{C_i C_v - C_{ie}(T)C_{ve}(T)\} -$$

$$\Theta(T_v - T)\Theta(T - T_P)\Theta(C_v - C_{ve})N_v \times 4\pi r_v D_v(C_v - C_{ve}) -$$

$$\Theta(C_v - C_{ve})\Theta(T_p - T) \times 4\pi R_p N_p \times \frac{D_v(C_v - C_{ve})}{1 + \frac{D_v}{g_v R_p}} -$$

$$\Theta(C_v - C_{ve}) \times 4\pi D_v(C_v - C_{ve}) \int J_c(t')r_c(t, t')dt'$$

At step 15, the simulation system determines the incidence $J_c$ of oxygen precipitation nuclei per unit time and the critical radius $r_{cr}$ of the nuclei based on the distribution of densities of oxygen, of densities of air holes and of temperatures within silicon single crystal 14. Specifically, since the growth of oxygen precipitation nuclei ($SiO_x$ phase) depends on the density $C_0$ of oxygen, density $C_v$ of air holes, and temperature T, the incidence $J_c$ of oxygen precipitation nuclei at a steady state per unit time can be obtained from equation (25) below according to the classical theory.

Formula 21

$$J_c = \sigma_c D_O C_O \left[\frac{3F*k_B T}{16\pi}\right]^{-1/2} \exp\left[-\frac{F^*}{k_B T}\right] \quad (25)$$

In equation (25), $\sigma_c$ represents energy at the interface between $SiO_x$ and Si at the oxygen precipitation nucleus formation temperature, $D_0$ the diffusion coefficient of oxygen, and $k_B$ Boltzman constant. F* represents the growth barrier of oxygen precipitation nuclei, and can be obtained from equation (26) below if it is assumed that the oxygen precipitation nuclei have a spherical form.

Formula 22

$$F^* = \frac{16\pi\sigma_c^3}{3\rho_c^2 f_c^2} \quad (26)$$

In equation (26), 92 $_c$ represents the numerical density of oxygen of oxygen precipitation nuclei consisting of $SiO_x$, and $f_c$ driving force (force per one oxygen atom) necessary for the formation of an oxygen precipitation nucleus. fc can be obtained from equation (27) below.

Formula 23

$$f_c = k_B T \times \ln(C_O/C_{Oe}) + \gamma k_B T \times \ln(C_v/C_{ve}) \quad (27)$$

In equation (27), $C_0$ represents the density of oxygen at the oxygen precipitation nucleus formation temperature, and $C_{Oe}$ the equilibrium density of oxygen. $\gamma$ represents the fraction of an air hole for one oxygen atom which allows the distortion-free production of oxide, and depends on the phase of oxygen precipitation nuclei. When oxygen precipitation nuclei are made of $SiO_2$, $\gamma \approx 0.5$, and when they are made of SiO, $\gamma \approx 0.65$. $C_v$ represents the density of air holes, and $C_{ve}$ the equilibrium density of air holes. It should be added here that $\sigma_c$ (energy at the interface between $SiO_x$ and Si at the oxygen precipitation nucleus formation temperature) in equations (25) and (26) is an important parameter that governs the formation of nuclei, and itself is affected by the formation of nuclei, that is, $\sigma_c$ generally varies dependent on the temperature and radius of an oxygen precipitation nucleus. The critical radius $r_{cr}$ of oxygen precipitation nuclei can be obtained from equation (28) below.

Formula 24

$$r_{cr} = 2\sigma_c / [\rho_c k_B T \times \ln\{(C_O/C_{Oe}) \times (C_v/C_{ve})^\gamma\}] \quad (28)$$

At step 16, the simulation system terminates, when the per-unit-time incidence of oxygen precipitation nuclei exceeds zero, computation for determining the radius of voids 21 and thickness of inner wall oxide membrane 22, and determines instead the radius of oxygen precipitation nuclei. The oxygen precipitation nucleus grows by consuming oxygen and air holes, and air holes absorb distortions generated between Si and Si oxides ($SiO_x$). The inventive model assumes that the growth speed of oxygen precipitation nuclei is solely determined by the diffusion of oxygen and air holes. If $\gamma D_0 C_0 < D_v (C_v - C_{ve})$, the growth speed of oxygen precipitation nuclei is determined solely by the diffusion of oxygen which is obtained from equation (29) below.

Formula 25

$$dr_c/dt = D_O C_O/(r_c \rho_c) \quad (29)$$

If $\gamma D_0 C_0 > D_v (C_v - C_{ve})$, air holes will be consumed to cancel out distortions between Si and Si oxides ($SiO_x$) during the growth of clusters. Thus, the growth speed of clusters can be expressed by equation (30) below.

Formula 26

$$dr_c/dt = D_v (C_v - C_{ve})/(\gamma r_c \rho_c) \quad (30)$$

The simulation system repeats steps 8 to 16 described above until the cooling of silicon single crystal 14 is completed (step 17). For this purpose, the simulation system uses equations (9) to (30) interchangeably with each other with the aid of the computer.

As described above, the simulation system determines the distribution of internal temperatures of silicon single crystal 14 growing from silicon melt 12 with due consideration paid to convection currents of silicon melt 12. Then, the system deals with silicon single crystal 14 separated from silicon melt 12, and undergoing cooling process, and undertakes a similar analysis considering the cooling process consisting of slow and rapid cooling phases. Thus, it is possible to precisely predict the distribution of densities and sizes of oxygen precipitation nuclei within a silicon single crystal 14 (FIG. 5). Specifically, the simulation system determines, with the aid of the computer, the distribution of densities and sizes of void defects comprising voids 21 and oxide membranes 22 attached to the inner wall of voids (FIG. 6) within silicon single crystal 14 with due consideration paid to the pulled-up speed of silicon single crystal 14 after the crystal is separated from silicon melt 12, while the system follows, with the aid of the computer, the per-unit-time incidence $J_c$ of oxygen precipitation nuclei and their critical radius $r_{cr}$, and when it finds that the per-unit-time incidence $J_c$ of oxygen precipitation nuclei having a radius equal to or above the critical radius $r_{cr}$ exceeds zero, terminates computation for determining the radius $r_c$ of voids and the thickness d of inner wall oxide membrane, and determines instead the radius $r_c$ of the oxygen precipitation nuclei having a radius equal to or above the critical radius $r_{cr}$. By determining the per-unit-time incidence $J_c$ of oxygen precipitation nuclei having a radius equal to or above the critical radius $r_{cr}$, it is possible to precisely predict the distribution of densities of oxygen precipitation nuclei within silicon single crystal 14. Also by determining the radius $r_c$ of oxygen precipitation nuclei having a radius equal to or above the critical radius $r_{cr}$, it is possible to precisely predict the distribution of sizes of oxygen precipitation nuclei within silicon single crystal 14.

In the above description of the first and second embodiments, the single crystal is assumed to be made of silicon. However, the single crystal is not limited to silicon, but may include any single crystals including, for example, single crystals of GaAs, InP, ZnS, and ZnSe.

EXAMPLES

Next, Examples of the invention will be detailed below together with Comparative Examples.

Example 1

As shown in FIGS. 5 and 6, when a silicon single crystal 14 having a diameter of 6 inch was pulled up from a silicon melt 12 stored in a quartz crucible 13, the distribution of densities and sizes of void defects comprising voids 21 and inner wall membrane 22 in the silicon single crystal 14 was determined by the simulation method whose steps are shown in the flowcharts of FIGS. 1 to 4.

A mesh was applied onto the hot zone of silicon single crystal pulling-up machine 11 for ease of analysis. In this particular example, the transverse mesh placed on silicon melt 12 just beneath silicon single crystal 14 had a size of 0.75 mm, while the transverse mesh placed out of the zone of silicon single crystal 14 had a size of 1 to 5 mm. The longitudinal mesh placed at the interface between silicon single crystal 14 and melt 12 had a size of 0.25 to 5 mm. The eddy current parameter C for the eddy current model equation was set to be 0.45. The silicon single crystal 14 was pulled up stepwise by 50 mm from the time $t_0$ at which the crystal was pulled up till the time $t_1$ at which the crystal completed cooling process. Under the above-described conditions, the simulation system determined the distribution of temperatures within the silicon single crystal 14 with consideration paid to convection currents in the silicon melt 12.

Next, the simulation system divided the period from a time $t_0$ when silicon single crystal 14 was pulled up from silicon melt 12 to a time $t_1$ when silicon single crystal 14 completed cooling process at specified intervals or $\Delta t$ seconds (brief time intervals), gathered, for each mesh point of silicon single crystal 14, its coordinates and temperature for each interval $\Delta t$, and determined the distribution of internal temperatures of silicon single crystal 14 in terms of the pulled-up length and pulled-up height of silicon single crystal 14. In addition, the system determined the temperature at which void 2firstarted to form, and the distribution of densities and sizes of voids 21. Namely, the system determined, with the aid of a computer, the distribution of densities and sizes of voids 21 within the silicon single crystal 14 with due consideration paid to the cooling process consisting of slow and rapid cooling phases after the silicon single crystal 14 was separated from silicon melt 12.

According to the simulation system, it was assumed that oxide membrane 22 grows around a void 21 soon after the formation of the void 21. Thus, the temperature $T_P$ at which oxide membrane 22 starts to form was taken to be equal to the temperature $T_v$ at which void 2firstarts to form. The term "soon" used here means a "time interval between the formation of void and the next round of computation." Next, the simulation system determined the outer radius $R_P$ of inner wall oxide membrane 22 when the temperature was lowered below the membrane formation temperature, and also determined the thickness d of inner wall oxide membrane 22 by subtracting the outer radius $R_P$ of inner wall oxide membrane 22 from the radius of void 21. The density of inner wall oxide membrane was assumed to be equal to that of voids obtained above. The distribution of sizes of void defects comprising voids and inner wall oxide membrane, namely the distribution of inner wall oxide membranes 22 having an outer diameter of $R_P$ along a radial direction of the silicon single crystal was determined while the pulling-up speed of the silicon single crystal was varied. The results are indicated by solid lines in FIGS. 12(*a*) and 12(*b*). Similarly, the distribution of densities of void defects comprising voids and inner wall oxide membrane along a radial direction of the silicon single crystal was determined while the pulling-up speed of the silicon single crystal was varied. The results are indicated by solid lines in FIGS. 13(*a*) and 13(*b*).

Comparative Example 1

When a silicon single crystal having the same form with that of Example 1 was pulled up under the same condition, LSTD (laser scattering tomograph defects) developed in the crystal was studied. The distribution of sizes of LSTD was determined while the pulling-up speed of the silicon single crystal was varied, and the results are shown by solid dots in FIGS. 12(*a*) and 12(*b*). Similarly, the distribution of densities of LSTD was determined while the pulling-up speed of the silicon single crystal was varied, and the results are shown by solid dots in FIGS. 13(*a*) and 13(*b*). LSTD is a sort of aggregate representing air-hole type point defect, and acts as a source of scattering light when exposed to an infrared beam because of its having a refractive index different from that of silicon. The distribution of densities and sizes of LSTD observed as above was thought comparable to the distribution of densities and sizes of void defects of Example 1. Since LSTD had a detection limit, it was not possible to detect LSTD having a size smaller than the specific limit.

Evaluation 1

As is obvious from FIGS. 12(*a*) and 12(*b*), the distribution of sizes of void defects of Example 1 is roughly correspondent with that of LSTD of Comparative Example 1, as far as the defects have a size equal to or larger than the detection limit.

As is obvious from FIGS. 13(*a*) and 13(*b*), when the distribution of densities of void defects of Example 1 is compared with that of LSTD of Comparative Example 1, the two are roughly correspondent in zone 1 while they are discordant in zone 2. The reason why they are discordant in zone 2 can be explained as follows: since in zone 2 detectable voids are intermingled with undetectable voids, the distribution of densities of LSTD of Comparative Example 1 becomes lower than the corresponding distribution of Example 1.

Example 2

As shown in FIGS. 5 and 6, when a silicon single crystal 14 having a diameter of 6 inch was pulled up from a silicon melt 12 stored in a quartz crucible 13, the distribution of densities and sizes of void defects comprising voids 21 and inner wall membrane 22 in the silicon single crystal 14 was determined by the simulation method whose steps are shown in the flowcharts of FIGS. 7 to 10.

A mesh was applied onto the hot zone of silicon single crystal pulling-up machine 11 for ease of analysis. In this particular example, the transverse mesh placed on silicon melt 12 just beneath silicon single crystal 14 had a size of 0.75 mm, while the transverse mesh placed out of the zone of silicon single crystal 14 had a size of 1 to 5 mm. The longitudinal mesh placed at the interface between silicon single crystal 14 and melt 12 had a size of 0.25 to 5 mm. The eddy current parameter C for the eddy current model equation was set to be 0.45. The silicon single crystal 14 was pulled up stepwise by 50 mm from the time $t_0$ at which the crystal was pulled up till the time $t_1$ at which the crystal completed cooling process. Under the above-described conditions, the simulation system determined the distribution of temperatures within the silicon single crystal 14 with consideration paid to convection currents in the silicon melt 12.

Next, the simulation system divided the period from a time $t_0$ when silicon single crystal 14 was pulled up from silicon melt 12 to a time $t_1$ when silicon single crystal 14 completed cooling process at specified intervals or $\Delta t$ seconds (brief time intervals), gathered, for each mesh point of silicon single crystal 14, its coordinates and temperature for each interval $\Delta t$, and determined the distribution of internal temperatures of silicon single crystal 14 in terms of the pulled-up length and pulled-up height of silicon single crystal 14. In addition, the system determined the temperature at which void 2firstarted to form, and the distribution of densities and sizes of voids 21. Namely, the system determined, with the aid of a computer, the distribution of densities and sizes of voids 21 within the silicon single crystal 14 with due consideration paid to the cooling process consisting of slow and rapid cooling phases after the silicon single crystal 14 was separated from silicon melt 12.

According to the simulation system, it was assumed that oxide membrane 22 grows around a void 21 soon after the formation of the void 21. Thus, the temperature $T_P$ at which oxide membrane 22 starts to form was taken to be equal to the temperature $T_v$ at which void 2firstarts to form. The term "soon" used here means a "time interval between the formation of void and the next round of computation." Next, the simulation system determined the outer radius $R_P$ of inner wall oxide membrane 22 when the temperature was lowered below the membrane formation temperature, and also determined the thickness d of inner wall oxide membrane 22 by subtracting the outer radius $R_P$ of inner wall oxide membrane 22 from the radius of void 21. The density of inner wall oxide membrane was assumed to be equal to that of voids obtained above.

Then, the system determined, with the aid of the computer, the per-unit-time incidence $J_c$ of oxygen precipitation nuclei and their critical radius $r_{cr}$, based on the distribution of oxygen, of air holes and of temperatures within the silicon single crystal 14. When the system found that the per-unit-time incidence $J_c$ of oxygen precipitation nuclei having a radius equal to or above the critical radius $r_{cr}$ exceeds zero, it terminated computation for determining the radius $r_c$ of voids and thickness d of inner wall oxide membrane, and determined instead the radius $r_c$ of the oxygen precipitation nuclei having a radius equal to or above the critical radius $r_{cr}$.

The distributions of sizes and densities of oxygen precipitation nuclei obtained from two different sites (sites A and B of FIG. 14(a)) in the radial direction of silicon single crystal 14 are shown by solid lines A and B of FIG. 14(b). Similarly, the distributions of sizes and densities of oxygen precipitation nuclei obtained at two different pulling-up speeds (spots A and C of FIG. 14(a)) are shown by solid lines A and C of FIG. 14(b).

Comparative Example 2

A silicon single crystal having the same form with that of Example 1 was pulled up under the same condition, and the resulting silicon single crystal was used as Comparative Example 2.

Comparison Test 1 and Evaluation 2

Of the distribution of densities of oxygen precipitation nuclei of spots A, B and C of FIG. 14(a) obtained by the method of Example 2, the total numbers of oxygen precipitation nuclei of those spots (A1, B1 and C1) having a size equal to or larger than a specified level which was found by experience to depend on certain conditions of heating were determined by means of the computer. The results are shown in Table 1. On the other hand, for the silicon single crystal of Comparative Example 2, spots A, B and C of FIG. 14(a) were subjected to specified heating treatment, and the distribution of densities of oxygen precipitation nuclei at those spots was examined by microscopy. The results are also shown in Table 1.

TABLE 1

| | Density distribution of oxygen precipitation nuclei (/cm$^3$) | | |
|---|---|---|---|
| | Spot A | Spot B | Spot C |
| Example 2 | $1 \times 10^{10}$ | $1 \times 10^9$ | $5 \times 10^7$ |
| Comparative Example 2 | $4 \times 10^{10}$ | $7 \times 10^9$ | $8 \times 10^7$ |

As is obvious from Table 1, the distribution of densities of oxygen precipitation nuclei obtained by computation according to the method of Example 2 agrees in order with the corresponding distribution obtained by actual measurement in Comparative Example 2

It was concluded from the result that it is possible to predict the distribution of densities of oxygen precipitation nuclei by the method of Example 2 up to the accuracy of the same order.

INDUSTRIAL APPLICABILITY

The simulation method of the invention for predicting the distribution of densities and sizes of void defects and oxygen precipitation nuclei within a single crystal can be used for improving the quality of silicon single crystal pulled up according to the CZ method.

REFERENCE NUMERALS

Figure 1:
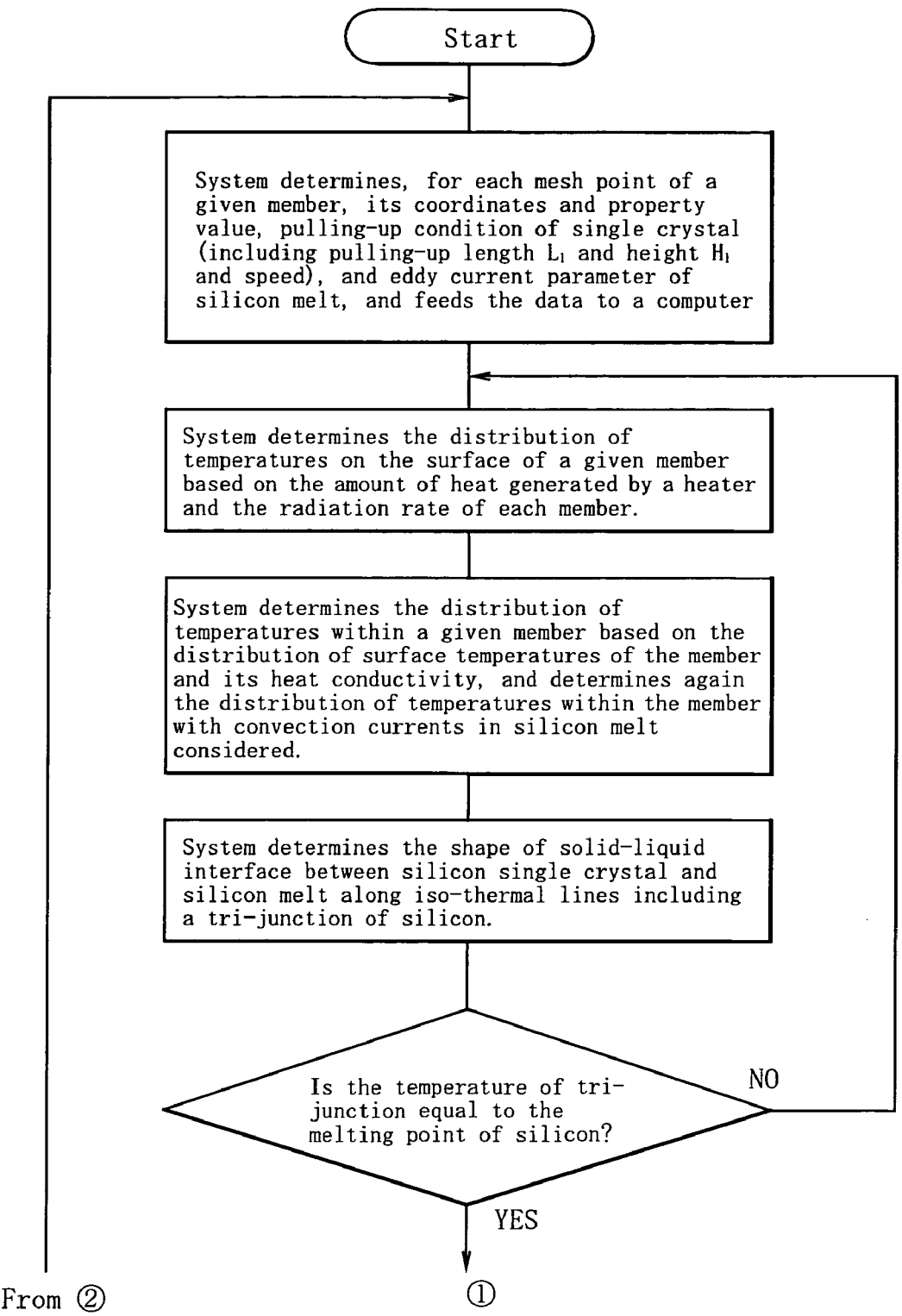
FIG. 1 is a flowchart for showing the first stage of a simulation method representing a first embodiment of the invention for predicting the distribution of densities and sizes of void defects developed in a silicon single crystal.
Figure 2:
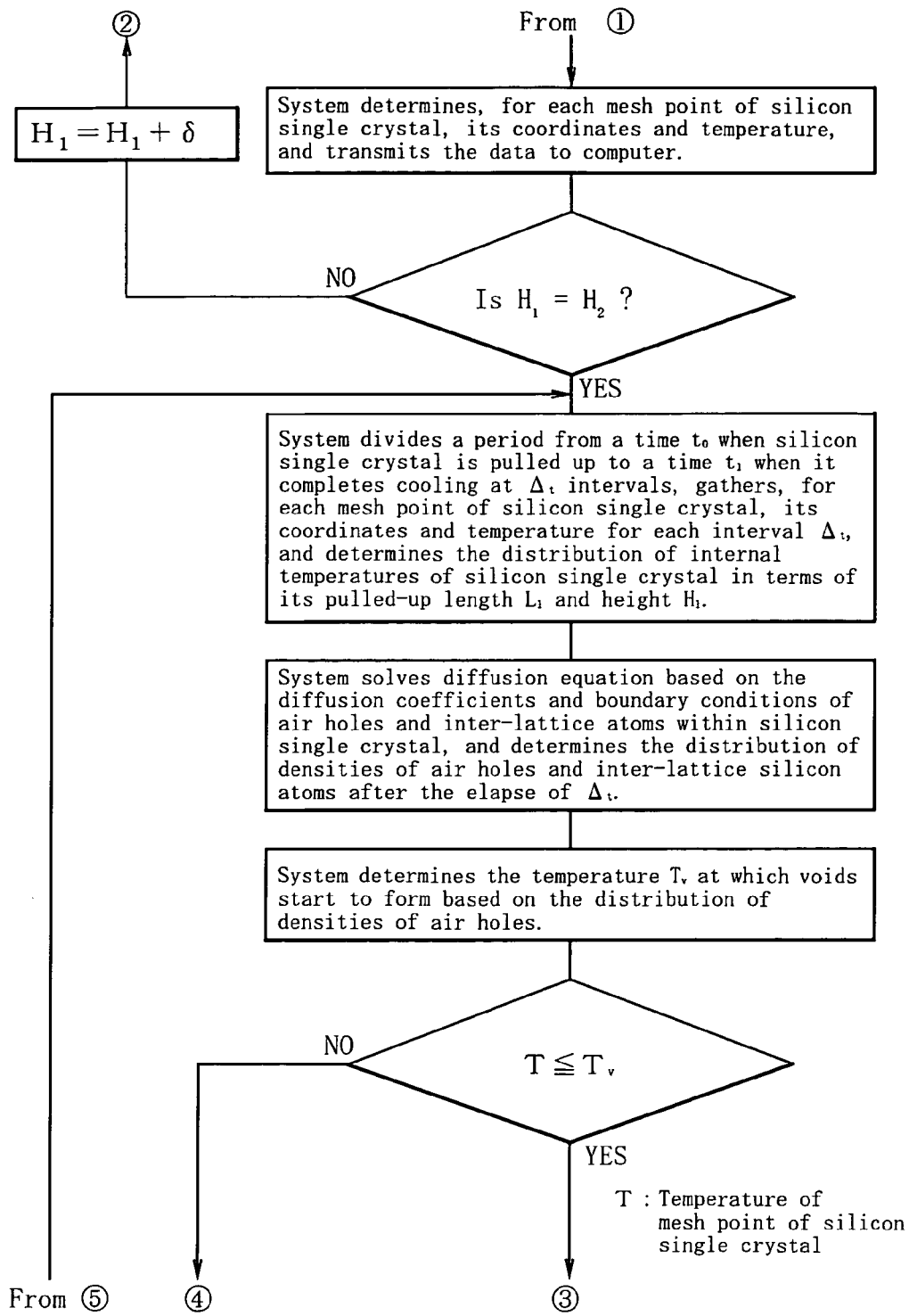
FIG. 2 is a flowchart for showing the second stage of the simulation method for predicting the distribution of densities and sizes of the void defects.
Figure 3:
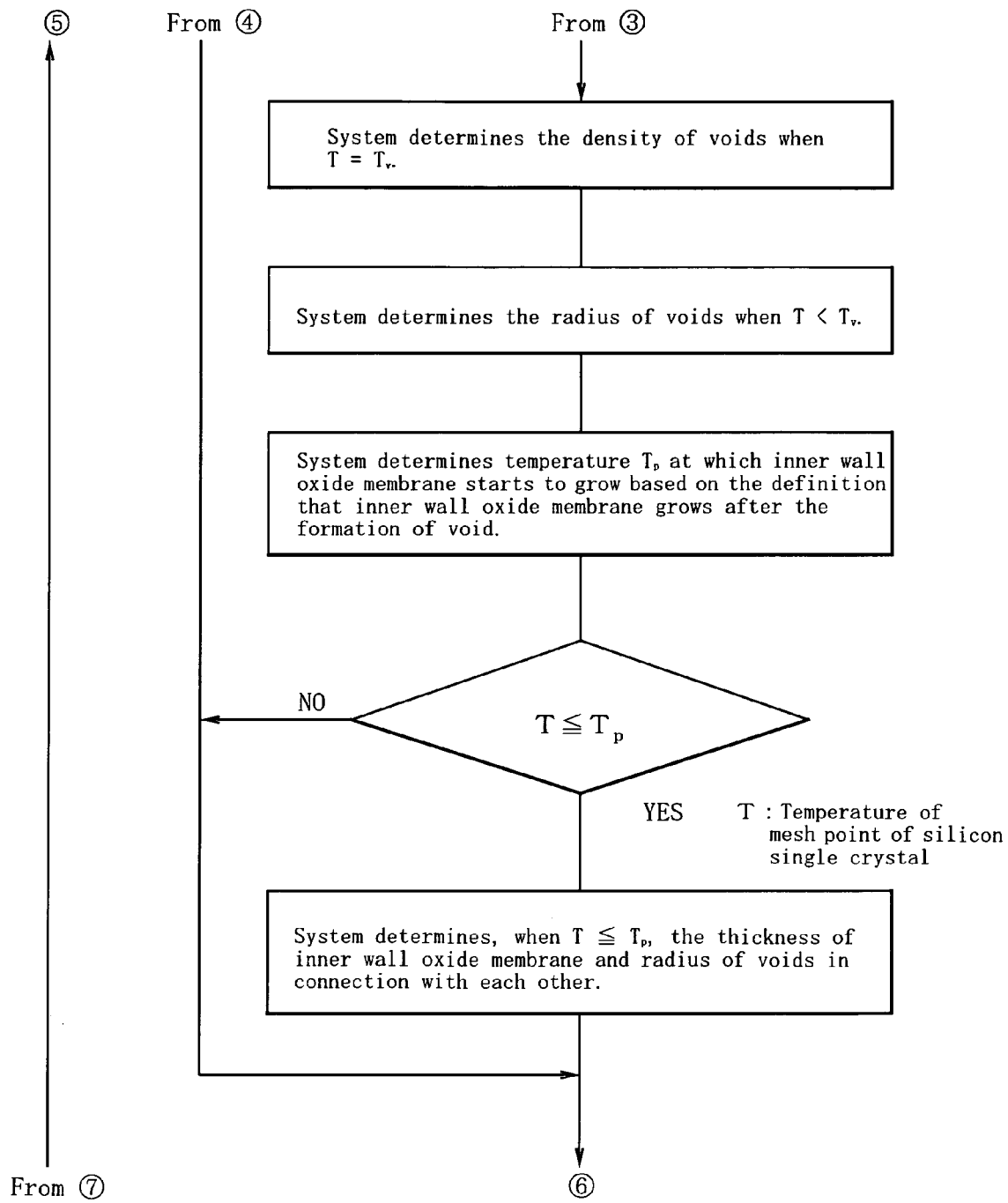
FIG. 3 is a flowchart for showing the third stage of the simulation method for predicting the distribution of densities and sizes of the void defects.
Figure 4:
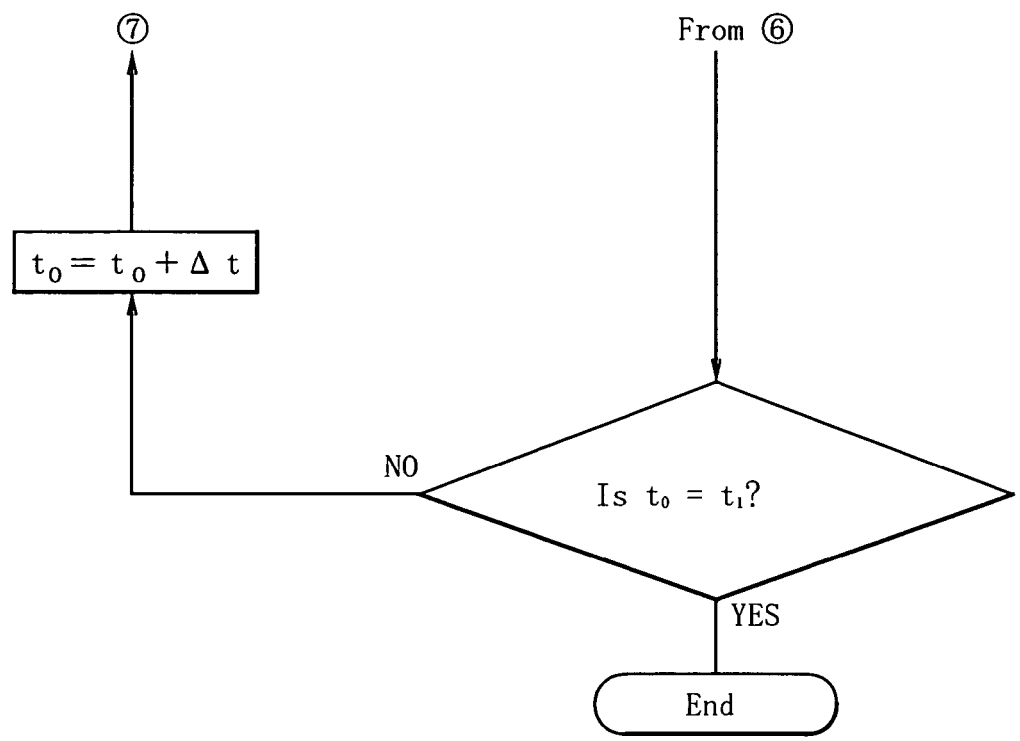
FIG. 4 is a flowchart for showing the fourth stage of the simulation method for predicting the distribution of densities and sizes of the void defects.
Figure 5:
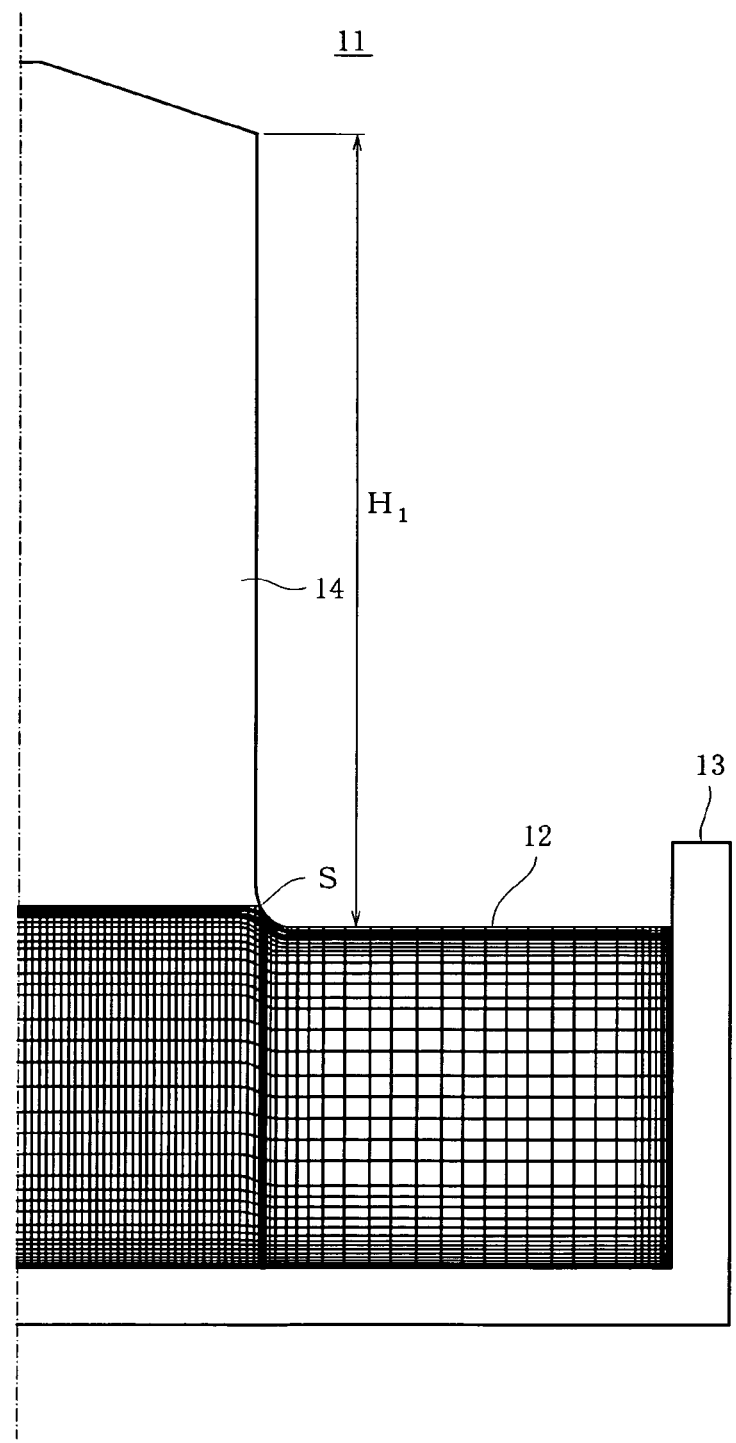
FIG. 5 is a sectional view of a pulling-up machine for preparing a silicon single crystal with parts of interest emphasized where a melt is assumed to have a mesh structure.
Figure 6:
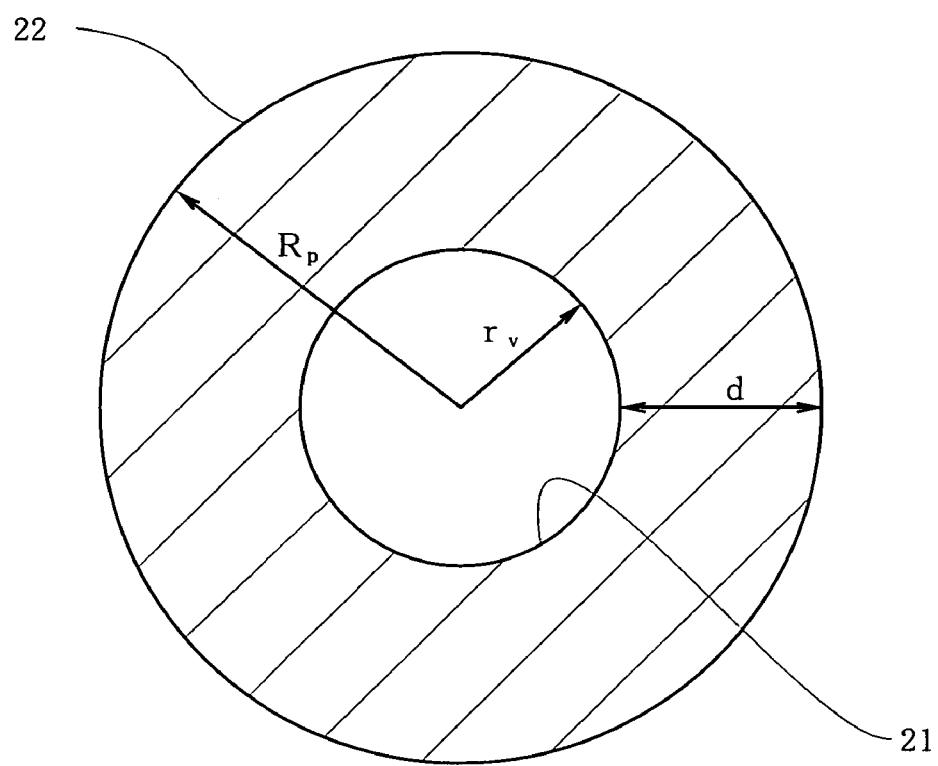
FIG. 6 is a diagram for showing a void developed within a silicon single crystal, and an inner wall oxide membrane.
Figure 7:
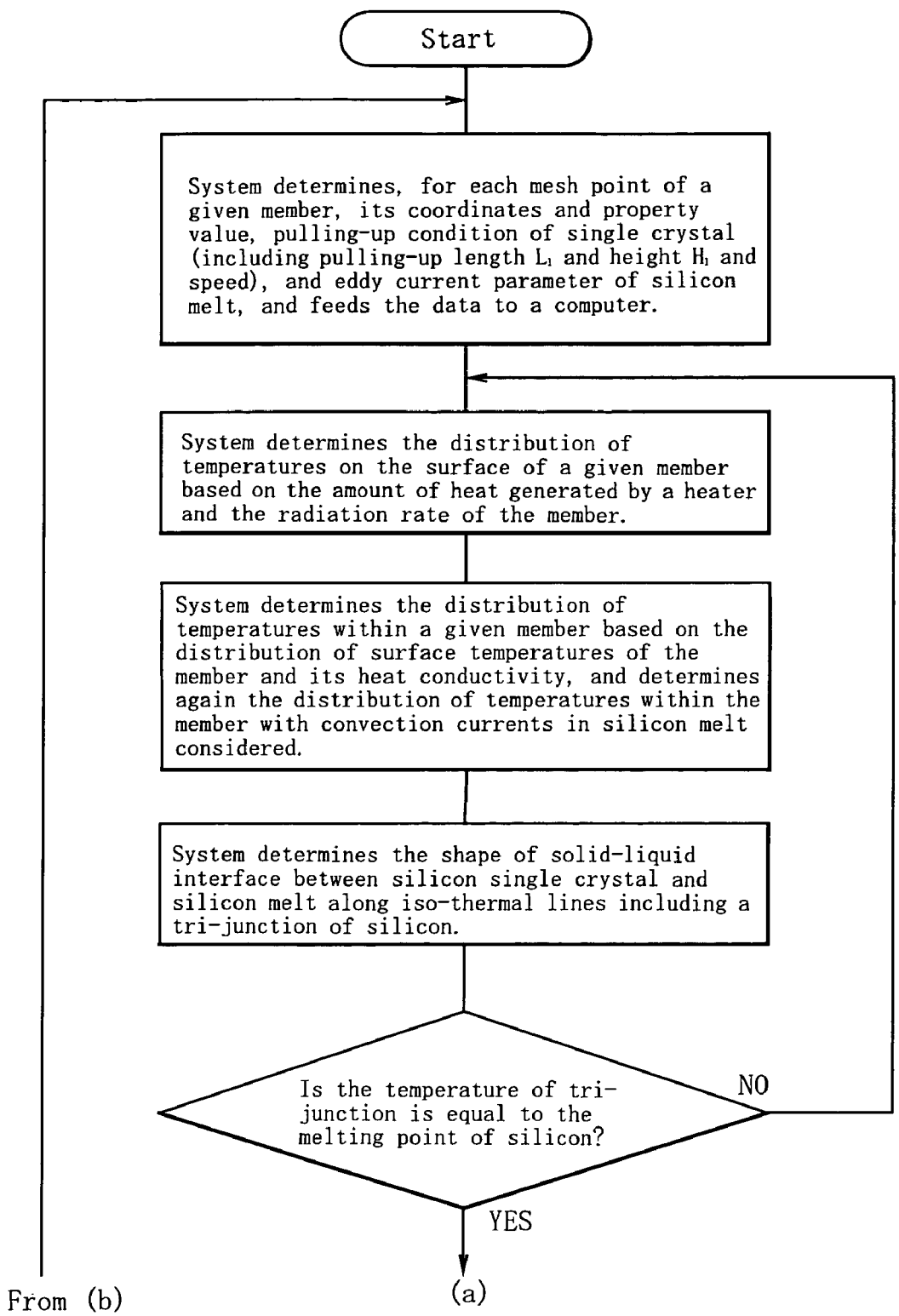
FIG. 7 is a flowchart for showing the first stage of a simulation method representing a second embodiment of the invention for predicting the distribution of densities and sizes of oxygen precipitation nuclei developed in a silicon single crystal.
Figure 8:
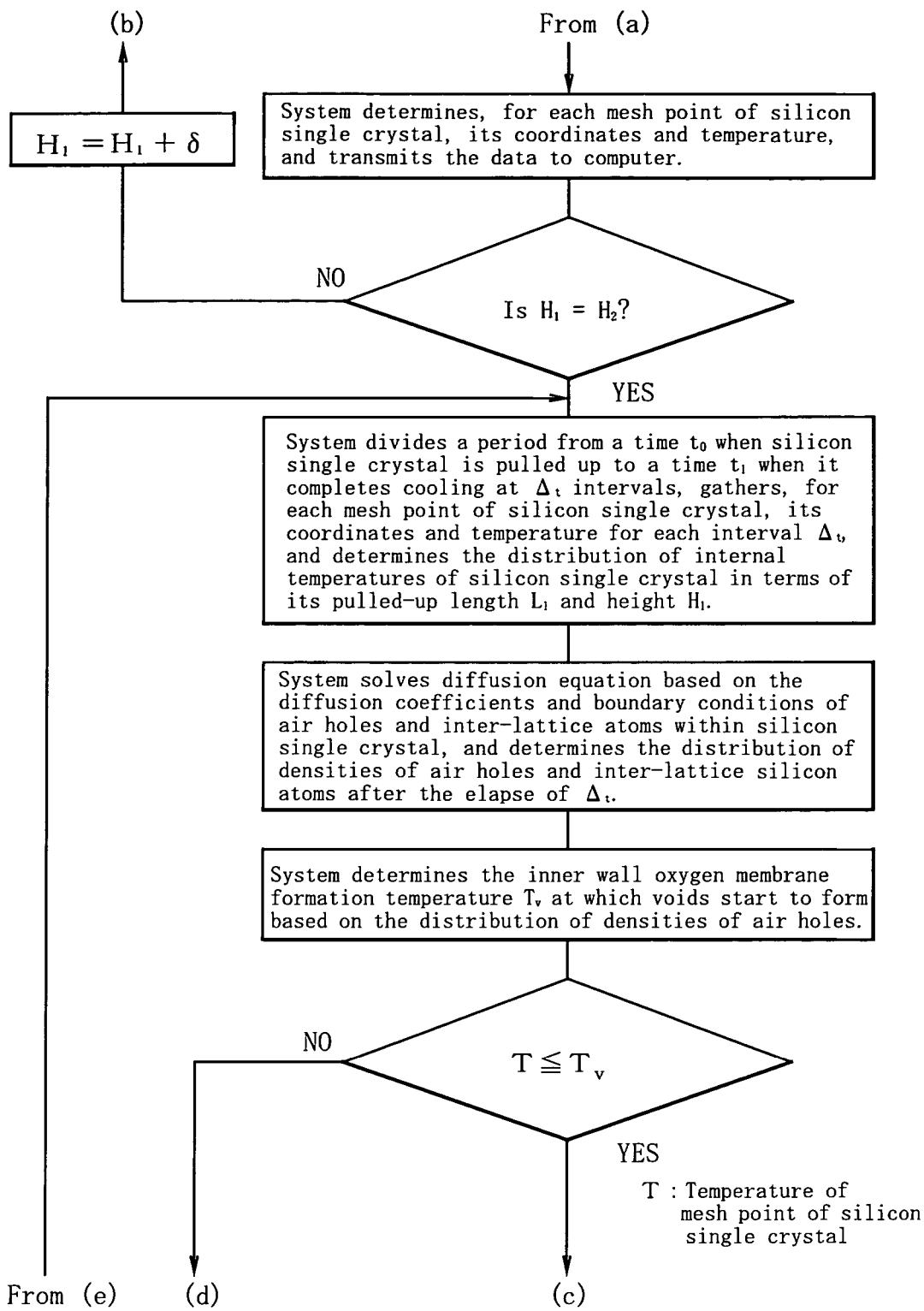
FIG. 8 is a flowchart for showing the second stage of the second simulation method for predicting the distribution of densities and sizes of oxygen precipitation nuclei.
Figure 9:
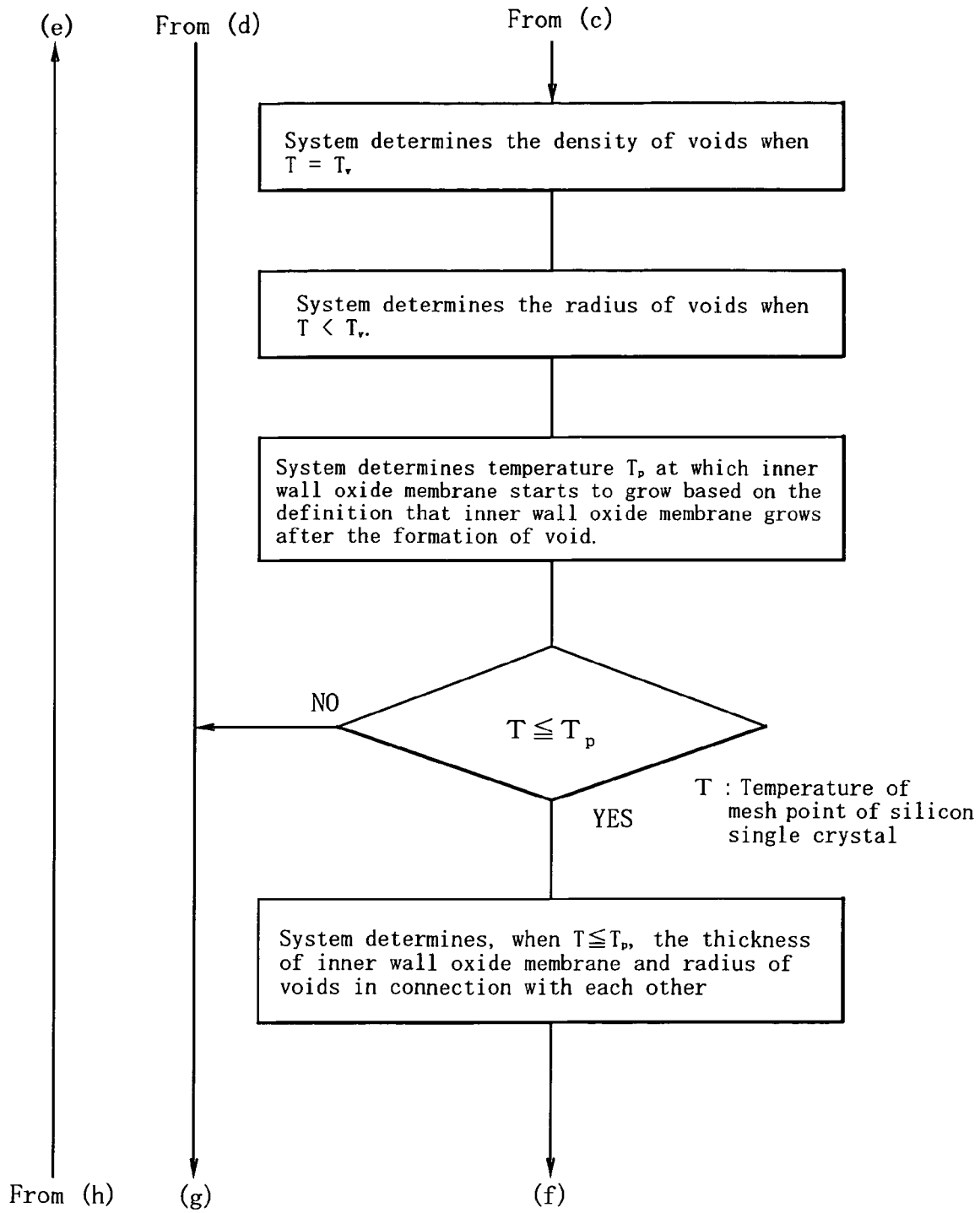
FIG. 9 is a flowchart for showing the third stage of the second simulation method for predicting the distribution of densities and sizes of oxygen precipitation nuclei.
Figure 10:
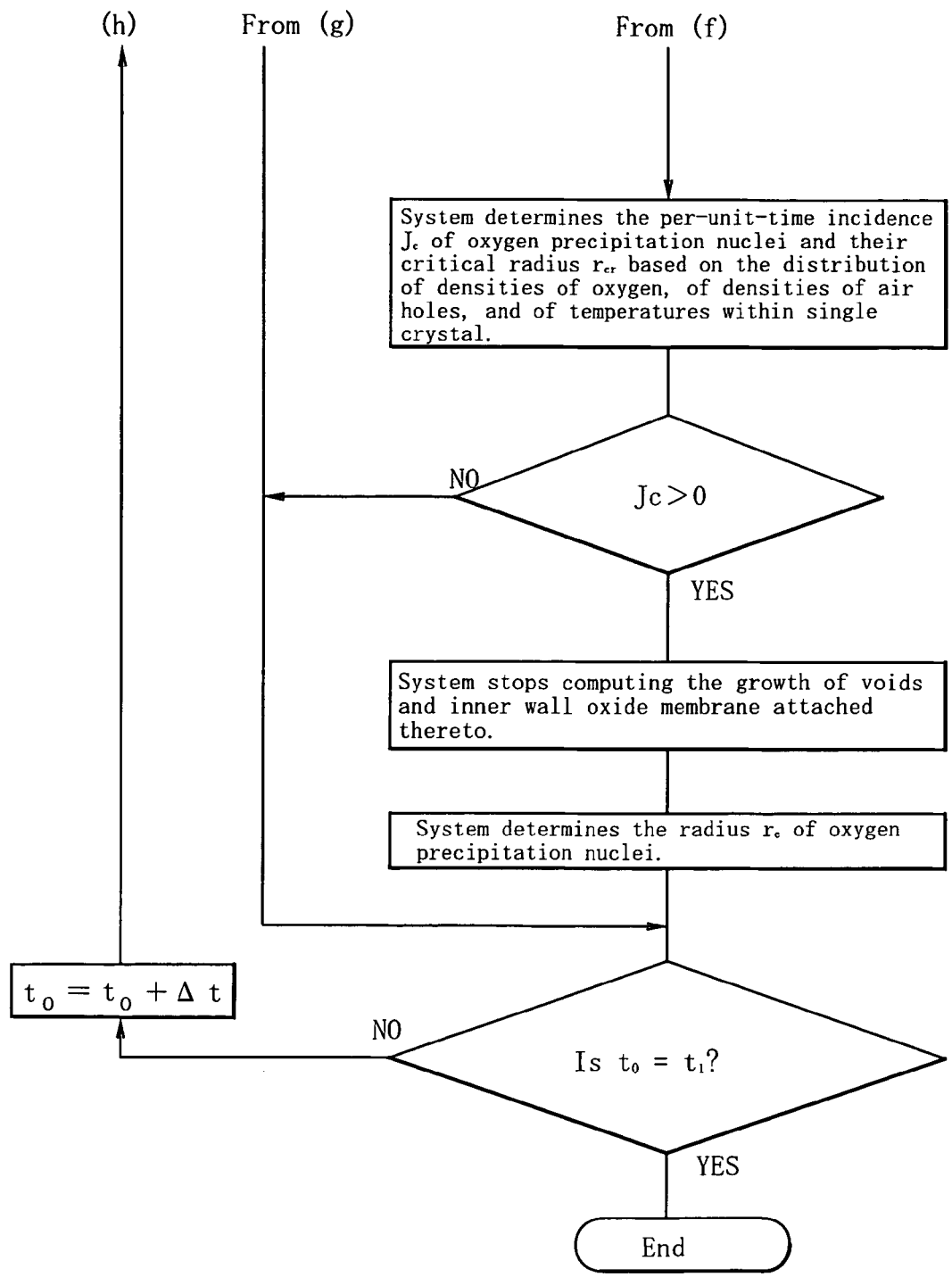
FIG. 10 is a flowchart for showing the fourth stage of the second simulation method for predicting the distribution of densities and sizes of oxygen precipitation nuclei.
Figure 11:
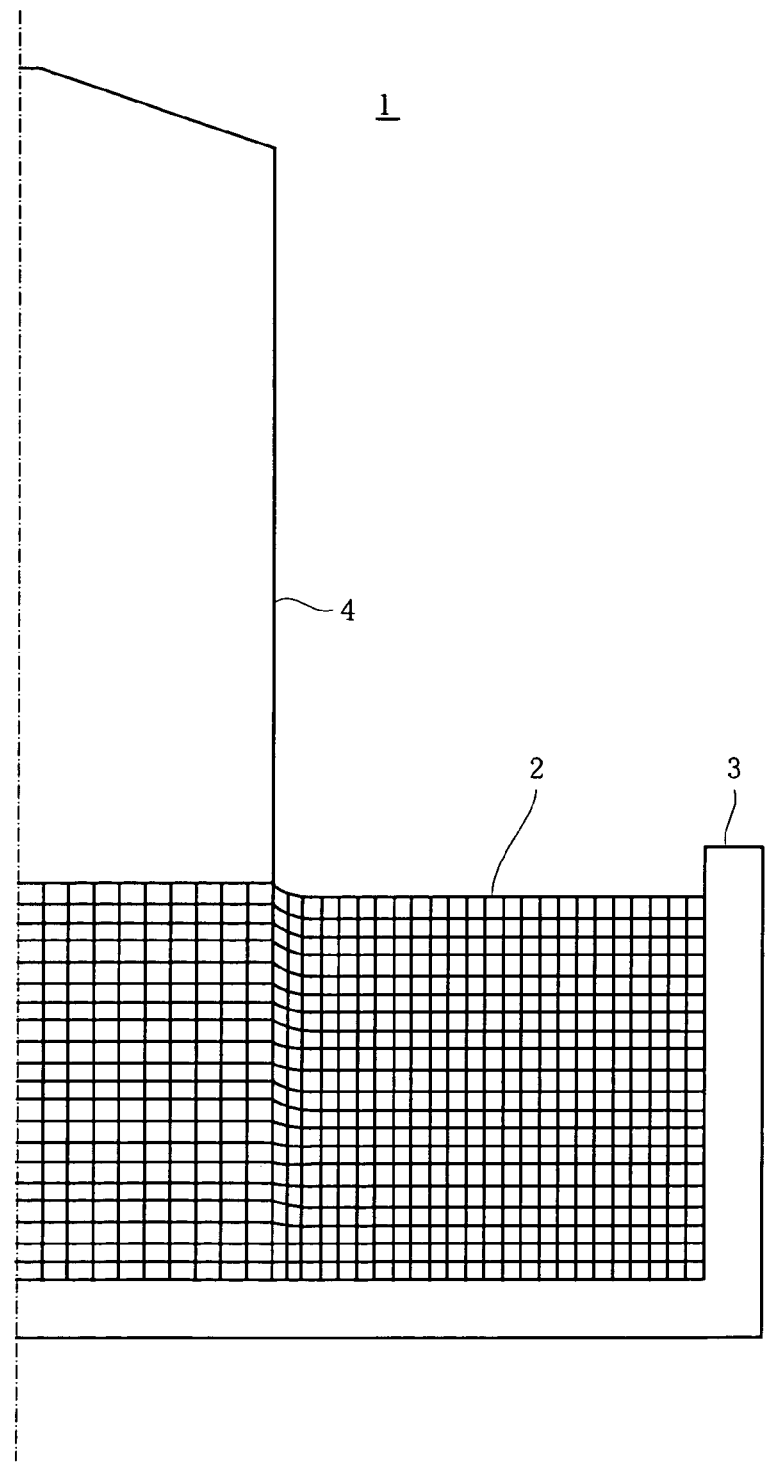
FIG. 11 is a sectional view of a conventional pulling-up machine for preparing a silicon single crystal with parts of interest emphasized where a melt is assumed to have a mesh structure.
Figure 12:
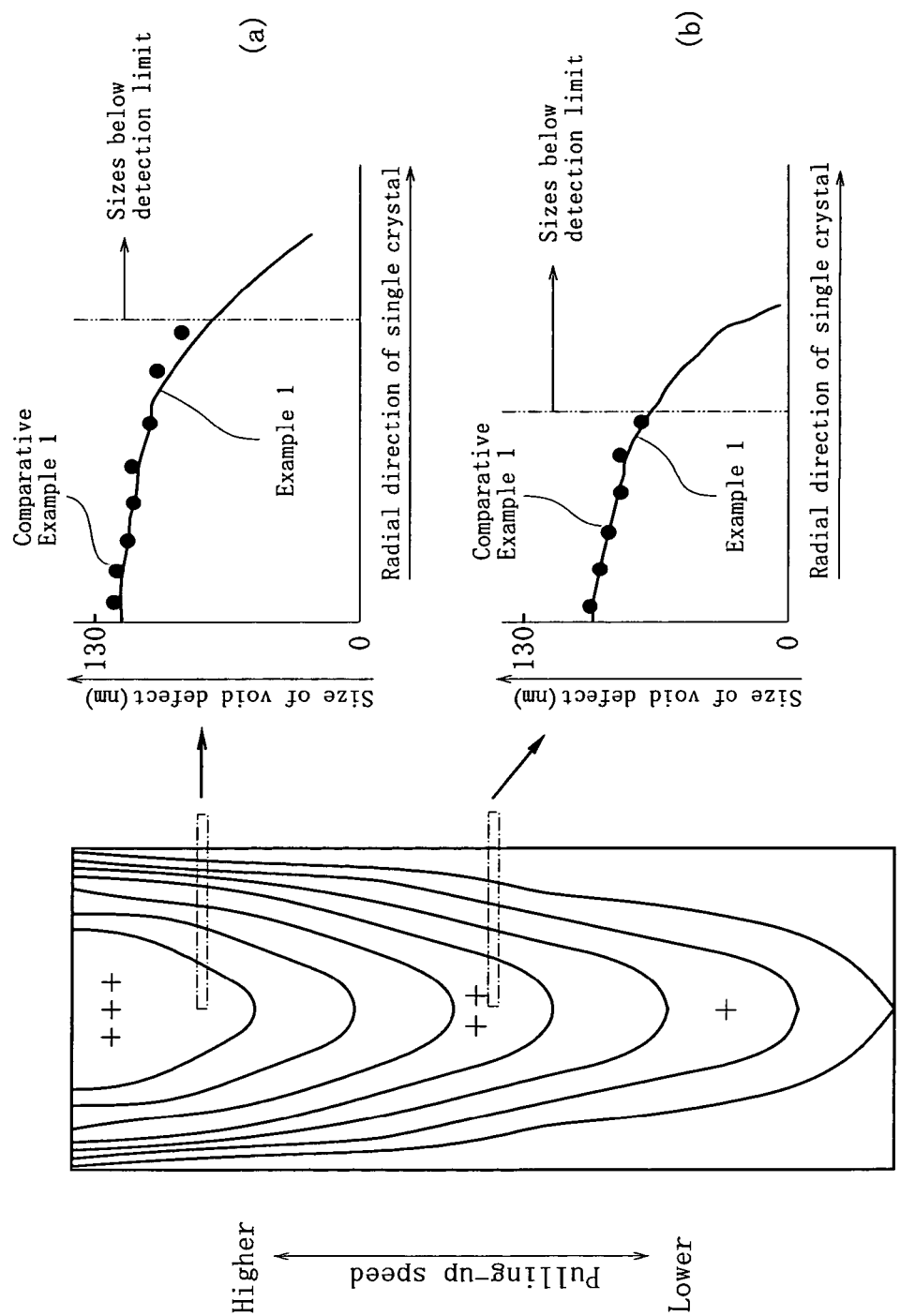
FIG. 12 illustrates the distribution of sizes of void defects in the radial direction of a silicon single crystal when the pulling-up speed of the crystal is varied obtained in Example 1. The results of Comparative Example 1 are also shown where the distribution of sizes of LSTD in the radial direction of a silicon single crystal is determined while the pulling-up speed of the crystal is varied.
Figure 13:
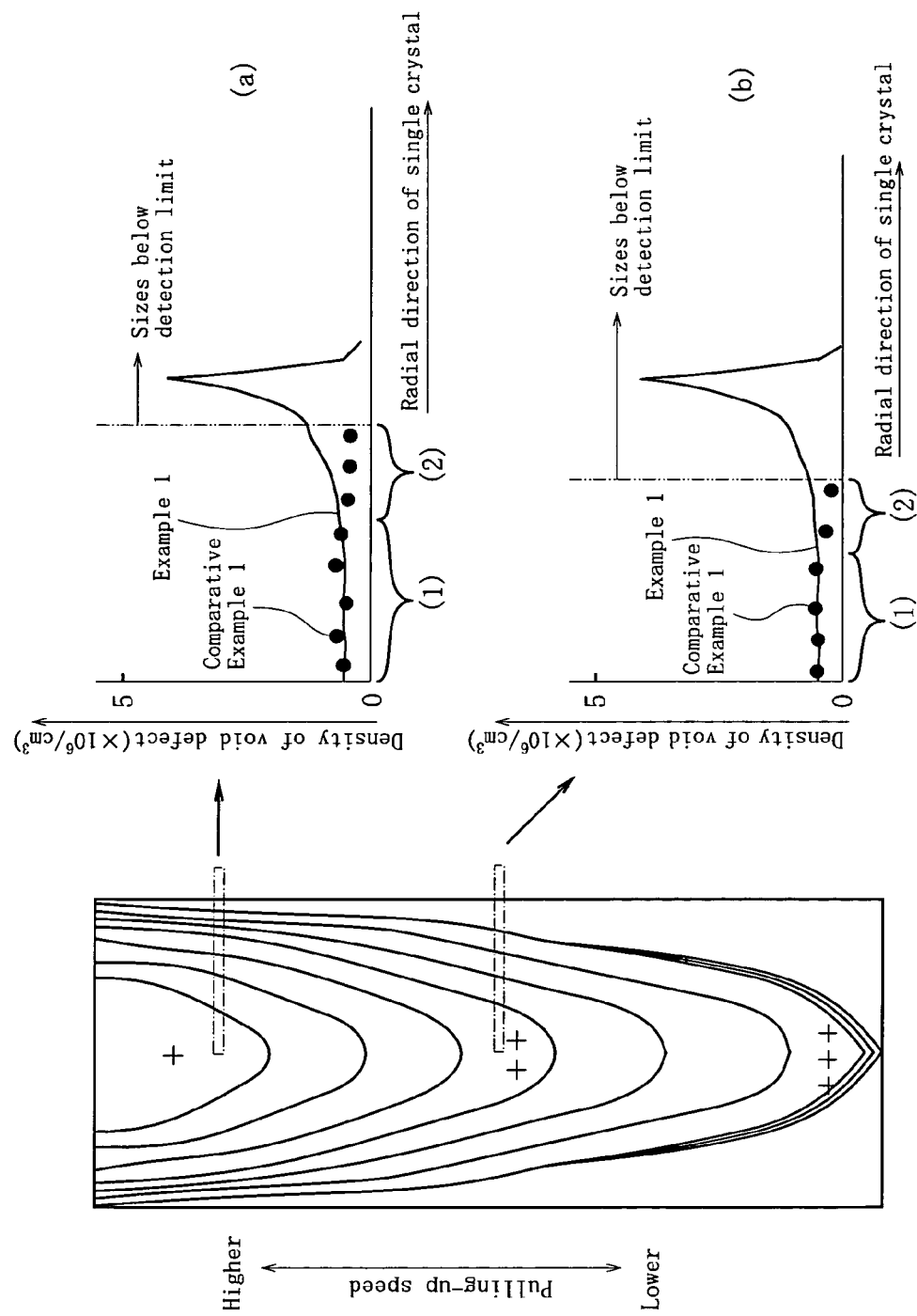
FIG. 13 illustrates the distribution of densities of void defects in the radial direction of a silicon single crystal when the pulling-up speed of the crystal is varied obtained in Example 1. The results of Comparative Example 1 are also shown where the distribution of densities of LSTD in the radial direction of a silicon single crystal is determined while the pulling-up speed of the crystal is varied.
Figure 14:
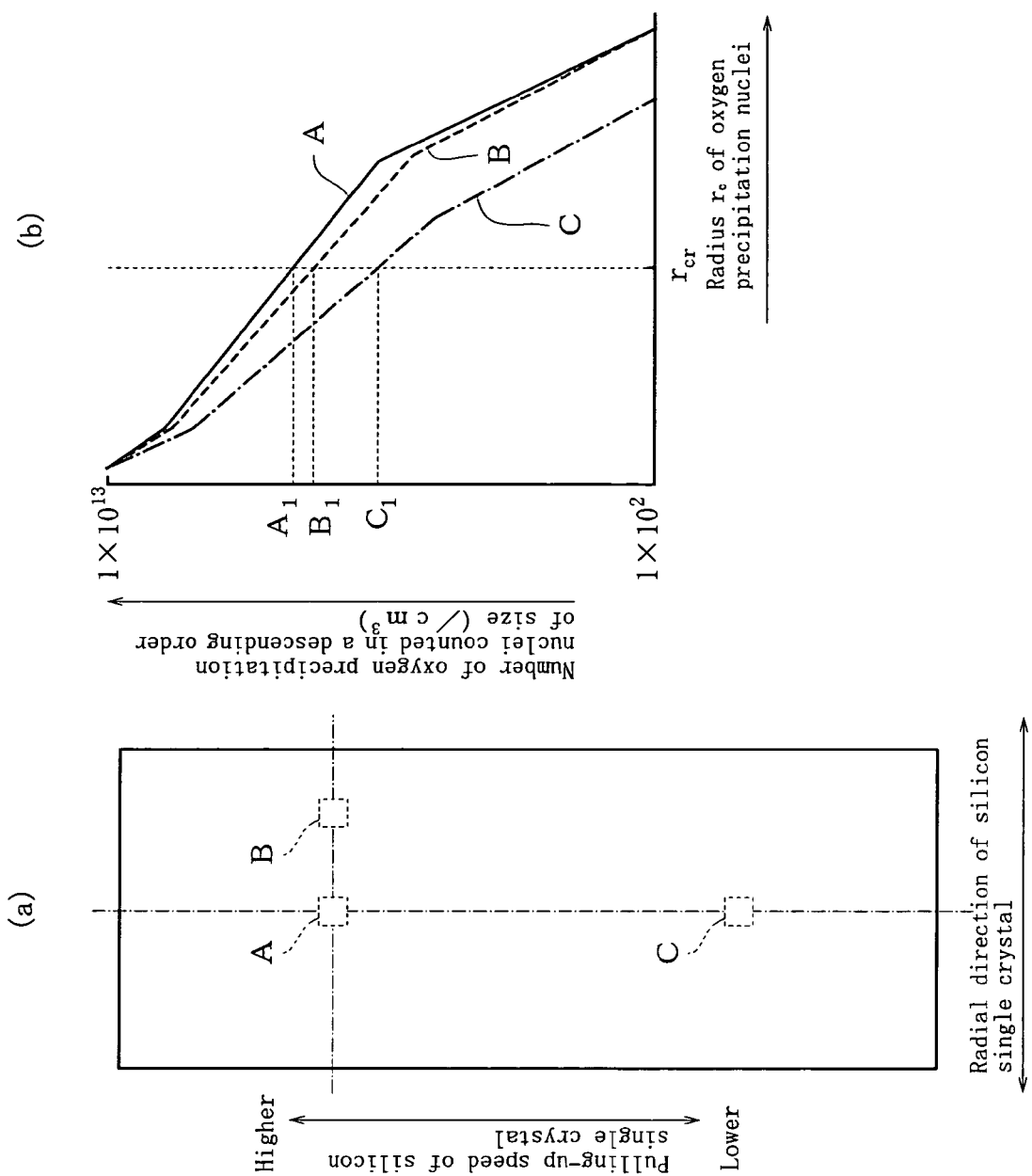
FIG. 14 illustrates the distributions of sizes and densities of oxygen precipitation nuclei obtained by means of a computer at two different sites in the radial direction of a silicon single crystal and at two different pulling-up speeds.

11: Silicon single crystal pulling-up machine
12: Silicon melt
14: Silicon single crystal
21: Void
22: Inner wall oxide membrane
S: Tri-junction of silicon

The invention claimed is:

1. A computer-based simulation method for predicting the distribution of densities and sizes of void defects in a single crystal, the method comprising:
   a first step of applying a mesh onto each member in a hot zone of a pulling-up machine (11) for modeling from the start of pulling up a single crystal (14) from a melt (12) by the pulling-up machine (11) to the completion of cooling the single crystal (14);
   a second step of classifying mesh points according to individual members of the hot zone, assigning to mesh points classified to a given member a property value peculiar to the member, determining the pulled-up length of the single crystal (14) at a given time, and the pulling-up speed of the single crystal (14) at that time, and sending the data to a computer;
   a third step of determining the distribution of temperatures over the surface of the members of hot zone based on the heat amount generated by a heater and the radiation rate of the members;
   a fourth step of determining the distribution of internal temperatures of the members of hot zone by solving a heat conduction equation based on the distribution of temperatures over the surface of the members and their heat conductivities, and then solving an eddy current model equation in conjunction with a Navier-Stokes equation assuming that the melt (12) includes eddy currents, thereby determining the distribution of internal temperatures of the melt (12) with due consideration paid to convention currents in the melt (12);
   a fifth step of determining the shape of the solid-liquid interface between the single crystal (14) and the melt (12) along isothermal lines including a tri-junction (S);
   a sixth step of repeating steps 3 to 5 until the tri-junction (S) is heated equal to or above the melting point of single crystal (14), determining the distribution of internal temperatures of the pull-up machine (11), gathering, for each mesh point of single crystal (14), its coordinates and temperature, and transmitting the data to the computer;
   a seventh step of altering stepwise the pulled-up length and height of single crystal (14), repeating steps 1 to 6, determining the distribution of internal temperatures of the pull-up machine (11), gathering, for each mesh point of single crystal 14, its coordinates and temperature, and transmitting the data to the computer;
   an eighth step of dividing, at specified intervals, the period from a time when the single crystal (14) is pulled up from the melt (12) to a time when the single crystal (14) completes a cooling process, gathering, for each mesh point of single crystal (14), its coordinates and temperature obtained by step 7 for each interval, and determining the distribution of internal temperatures of single crystal (14) in terms of the pulled-up length and height of single crystal (14);
   a ninth step of determining the distribution of densities of air holes and inter-lattice atoms within single crystal (14) accumulated during the time elapsed up to a given time interval by solving the diffusion equation based on the diffusion coefficients and boundary conditions of the air holes and inter-lattice atoms;
   a tenth step of determining the temperature at which voids (21) start to form based on the distribution of densities of air holes;
   an eleventh step of determining the density of voids (21) for each mesh point of single crystal (14) when the temperature is gradually lowered until it becomes equal to or below the temperature at which voids (21) start to form;
   a twelfth step of determining the radius of voids (21) for each mesh point of single crystal 14 when the temperature is below the temperature at which voids (21) start to form;
   a thirteenth step of determining the temperature at which inner wall oxide membrane (22) starts to grow around void (21);
   a fourteenth step of determining the radius of voids (21) and the thickness of inner wall oxide membrane (22) when the temperature is gradually lowered below the temperature at which inner wall oxide membrane (22) starts to grow, and relating the radius of void (21) with the thickness of inner wall oxide membrane (22); and
   a fifteenth step of repeating steps 8 to 14 until the cooling of single crystal (14) is completed.

2. A computer-based simulation method for predicting the distribution of densities and sizes of oxygen precipitation nuclei in a single crystal, the method comprising:
   a first step of applying a mesh onto each member in a hot zone of a pulling-up machine (11) for modeling from the start of pulling up a single crystal (14) from a melt

(12) by the pulling-up machine (11) to the completion of cooling the single crystal (14);

a second step of classifying mesh points according to individual members and reactants of the hot zone, assigning to mesh points classified to a given member a property value peculiar to the member, determining the pulled-up length of the single crystal (14) at a given time, and the pulling-up speed of the single crystal (14) at that time, and sending the data to a computer;

a third step of determining the distribution of temperatures over the surface of the members based on the heat amount generated by a heater and the radiation rate of the members;

a fourth step of determining the distribution of internal temperatures of the members of hot zone by solving a heat conduction equation based on the distribution of temperatures over the surface of the members, and their heat conductivities, and then solving an eddy current model equation in conjunction with a Navier-Stokes equation assuming that the melt (12) includes eddy currents, thereby determining the distribution of internal temperatures of the melt (12) with due consideration paid to convention currents in the melt (12);

a fifth step of determining the shape of the solid-liquid interface between the single crystal (14) and the melt (12) along isothermal lines including a tri-junction (S);

a sixth step of repeating steps 3 to 5 until the tri-junction (S) is heated equal to or above the melting point of single crystal (14), determining the distribution of internal temperatures of pulling-up machine (11), gathering, for each mesh point of single crystal (14), its coordinates and temperature, and transmitting the data to the computer;

a seventh step of altering stepwise the pulled-up length and height of single crystal (14), repeating steps 1 to 6, determining the distribution of internal temperatures of pulling-up machine (11), gathering, for each mesh point of single crystal (14), its coordinates and temperature, and transmitting the data to the computer;

an eighth step of dividing, at specified intervals, the period from a time when the single crystal (14) is pulled up from the melt (12) to a time when the single crystal (14) completes a cooling process, gathering, for each mesh point of single crystal (14), its coordinates and temperature obtained by step 7 for each interval, and determining the distribution of internal temperatures of single crystal (14) in terms of the pulled-up length and height of single crystal (14);

a ninth step of determining the distribution of densities of air holes and inter-lattice atoms within single crystal (14) accumulated during the time elapsed up to a given time interval by solving the diffusion equation based on the diffusion coefficients and boundary conditions of the air holes and inter-lattice atoms;

a tenth step of determining the temperature at which voids start to form based on the distribution of densities of air holes;

an eleventh step of determining the density of voids (21) for each mesh point of single crystal (14) when the temperature is gradually lowered until it becomes equal to or below the temperature at which voids (21) start to form;

a twelfth step of determining the radius of voids (21) for each mesh point of single crystal (14) when the temperature is below the temperature at which voids (21) start to form;

a thirteenth step of determining the temperature at which inner wall oxide membrane (22) starts to grow around void (21);

a fourteenth step of determining the radius of voids (21) and the thickness of inner wall oxide membrane (22) when the temperature is gradually lowered below the temperature at which inner wall oxide membrane (22) starts to grow, and relating the radius of void (21) with the thickness of inner wall oxide membrane (22);

a fifteenth step of determining the incidence of oxygen precipitation nuclei per unit time and the critical radius of the nuclei based on the distribution of densities of oxygen, of densities of air holes, and of temperatures within single crystal (14);

a sixteenth step of terminating, when the per-unit-time incidence of oxygen precipitation nuclei exceeds zero, computation for determining the radius of voids (21) and thickness of inner wall oxide membrane (22), and determining the radius of oxygen precipitation nuclei; and a seventeenth step of repeating steps 8 to 16 until the single crystal (14) completes cooling process.

* * * * *

UNITED STATES PATENT AND TRADEMARK OFFICE
CERTIFICATE OF CORRECTION

| | | |
|---|---|---|
| PATENT NO. | : 7,282,094 B2 | Page 1 of 1 |
| APPLICATION NO. | : 10/558790 | |
| DATED | : October 16, 2007 | |
| INVENTOR(S) | : Kounosuke Kitamura et al. | |

It is certified that error appears in the above-identified patent and that said Letters Patent is hereby corrected as shown below:

On the Title Page item [75]:  now reads, "Applicant(s): Naoki Ibi, Tokyo, JAPAN" and should read, --Applicant(s): Naoki Ono, Tokyo, JAPAN--.

On the Title Page item [56]:  now reads, "Domestic Priority Data as Claimed by Applicant: This application is a 371 of PCT/JP04/06822 05/30/2004" and should read, --Domestic Priority Data as Claimed by Applicant: This application is a 371 of PCT/JP04/06822 05/20/2004--.

On the Title Page:  now reads, "Title: Method of simulation with respect to density distribution and size distribution of void defect within single crystal and oxygen precipitation nucleus within single crystal" and should read, --Title: Simulation method for predicting the distribution of densities and sizes of void defects and oxygen precipitation nuceli in a single crystal--.

Signed and Sealed this

Twenty-fifth Day of March, 2008

JON W. DUDAS
*Director of the United States Patent and Trademark Office*

UNITED STATES PATENT AND TRADEMARK OFFICE
CERTIFICATE OF CORRECTION

PATENT NO. : 7,282,094 B2
APPLICATION NO. : 10/558790
DATED : October 16, 2007
INVENTOR(S) : Kounosuke Kitamura et al.

It is certified that error appears in the above-identified patent and that said Letters Patent is hereby corrected as shown below:

On the Title Page: now reads, "Title: Method of simulation with respect to density distribution and size distribution of void defect within single crystal and oxygen precipitation nucleus within single crystal" and should read, --Title: Simulation method for predicting the distribution of densities and sizes of void defects and oxygen precipitation nuclei in a single crystal--.

On the Title Page item [75]: now reads, "Applicant(s): Naoki Ibi, Tokyo, JAPAN" and should read, --Applicant(s): Naoki Ono, Tokyo, JAPAN--.

On the Title Page item [56]: now reads, "Domestic Priority Data as Claimed by Applicant: This application is a 371 of PCT/JP04/06822 05/30/2004" and should read, --Domestic Priority Data as Claimed by Applicant: This application is a 371 of PCT/JP04/06822 05/20/2004--.

This certificate supersedes the Certificate of Correction issued March 25, 2008.

Signed and Sealed this

Twenty-first Day of July, 2009

JOHN DOLL
*Acting Director of the United States Patent and Trademark Office*